(12) United States Patent
Copeland

(10) Patent No.: US 9,054,928 B1
(45) Date of Patent: Jun. 9, 2015

(54) CREST FACTOR REDUCTION

(71) Applicant: Xilinx, Inc., San Jose, CA (US)

(72) Inventor: Gregory C. Copeland, Savannah, TX (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 14/444,612

(22) Filed: Jul. 28, 2014

(51) Int. Cl.
  *H04L 27/26* (2006.01)
  *H04B 1/04* (2006.01)

(52) U.S. Cl.
  CPC .......... *H04L 27/2614* (2013.01); *H04B 1/0475* (2013.01); *H04B 2201/70706* (2013.01)

(58) Field of Classification Search
  CPC .............. H04B 2201/70706; H04B 1/0475; H04B 2001/0425; H04L 27/2624; H04L 27/2614; H04L 27/2623
  USPC ....................................... 375/296; 455/114.2
  See application file for complete search history.

(56) References Cited

U.S. PATENT DOCUMENTS

| | | | | |
|---|---|---|---|---|
| 5,638,403 | A * | 6/1997 | Birchler et al. ............... | 375/296 |
| 7,013,161 | B2 * | 3/2006 | Morris .......................... | 455/522 |
| 7,616,710 | B2 | 11/2009 | Kim et al. | |
| 7,634,024 | B2 * | 12/2009 | Tan ............................... | 375/297 |
| 7,697,591 | B2 * | 4/2010 | Copeland ...................... | 375/130 |
| 7,839,949 | B2 * | 11/2010 | Hamada et al. ................ | 375/296 |
| 8,085,870 | B2 * | 12/2011 | Okada et al. ................... | 375/297 |
| 8,259,846 | B2 * | 9/2012 | Liang et al. .................... | 375/296 |
| 8,265,196 | B2 * | 9/2012 | Gandhi .......................... | 375/296 |
| 8,369,809 | B2 * | 2/2013 | Batruni .......................... | 455/219 |
| 8,446,202 | B2 * | 5/2013 | Sato et al. ...................... | 327/306 |
| 2005/0008094 | A1 * | 1/2005 | Kramer et al. ................. | 375/296 |
| 2005/0147262 | A1 * | 7/2005 | Breebaart ...................... | 381/106 |

(Continued)

OTHER PUBLICATIONS

Väänänen, Jouko Vankka et al., "Reducing the Peak to Average Ration of Multicarrier GSM and Edge Signals," *Proc. of the 13th IEEE International Symposium on Personal, Indoor and Mobile Radio Communications*, Sep. 15, 2002, pp. 115-119, vol. 1, IEEE, Piscataway, New Jersey, USA.

(Continued)

*Primary Examiner* — Sophia Vlahos
(74) *Attorney, Agent, or Firm* — Gerald Chan

(57) ABSTRACT

A system for crest factor reduction (CFR) includes a peak detector configured to receive an input signal ($x_k$); a running maximum filter configured to generate a scaling factor based on a window gain ($G_k$) and a filter length, wherein the window gain ($G_k$) is based on the input signal ($x_k$) and a threshold value (T); a window CFR gain filter configured to generate a gain correction ($F_k$) based on the scaling factor and the filter length; a delay configured to delay the input signal ($x_k$) to generate a delayed input signal; a multiplier configured to multiply the gain correction ($F_k$) by the delayed input signal to obtain a peak correction value; and an adder configured to determine an output signal ($y_k$) based on the peak correction value and the delayed input signal.

17 Claims, 15 Drawing Sheets

(56) References Cited

U.S. PATENT DOCUMENTS

| | | |
|---|---|---|
| 2005/0190858 A1* | 9/2005 | Kim et al. .................... 375/296 |
| 2006/0029158 A1* | 2/2006 | Lipka et al. .................. 375/300 |
| 2006/0133524 A1* | 6/2006 | Hamada et al. .............. 375/260 |
| 2008/0095284 A1 | 4/2008 | Hori et al. |
| 2009/0029664 A1* | 1/2009 | Batruni ........................ 455/212 |
| 2009/0245414 A1* | 10/2009 | Okada et al. ................ 375/295 |
| 2010/0104055 A1 | 4/2010 | Jeong et al. |
| 2010/0158166 A1* | 6/2010 | Gandhi ........................ 375/345 |

OTHER PUBLICATIONS

Specification and drawings from U.S. Appl. No. 14/444,577, filed Jul. 28, 2014, Copeland.

* cited by examiner $G_k = 1 - 1/\sqrt{A/T^2}$
$F_k = G_k * W$
$y_k = \underbrace{x_k - F_k * x_k}_{\text{peak correction}}$

CREST FACTOR REDUCTION

TECHNICAL FIELD

The present disclosure relates to crest factor reduction (CFR). In particular, the disclosure relates to window CFR.

BACKGROUND

In some implementations of crest factor reduction (CFR), peak magnitude in a signal may be determined. Such may be accomplished by oversampling the signal, identifying signal magnitudes that are larger than two neighboring magnitudes, and then testing to determine if any of the signal magnitudes exceeds a predetermined threshold. If the oversampling rate of the signal is low, then the peak magnitude may not be accurate and may deviate significantly from the true peak value. As the oversampling rate decreases, there is a corresponding decrease in the accuracy in the estimate of the peak magnitude. This reduction in the accuracy of the peak magnitude estimate directly affects the quality of the CFR method. In some cases, the location of the detected peak and the complex signal value at the detected peak are required for peak cancellation crest factor reduction (PCCFR) and window CFR (WCFR). Thus, accurate peak detection is important for PCCFR and WCFR and other CFR methods One method for implementing CFR is the cancellation pulse method. Although this method is effective, it suffers from the issue that some peaks may be missed and/or created during execution of the cancellation pulse method. In particular, in the cancellation pulse method, some peaks may be missed due to a lack resources for pulse cancellation. Additionally, new peaks may be undesirably created when cancellation pulses overlap and add constructively. In some cases, pulse cancellation may be repeated in the cancellation pulse method some number of times to address these undesirable peaks. However, each processing stage is comparatively expensive and adds significantly to the latency in the system that implements the CFR. This, in turn, negatively affects an efficiency and capacity of a base station that implements the CFR.

SUMMARY

A system for crest factor reduction (CFR) includes a peak detector configured to receive an input signal ($x_k$); a running maximum filter configured to generate a scaling factor based on a window gain ($G_k$) and a filter length, wherein the window gain ($G_k$) is based on the input signal ($x_k$) and a threshold value (T); a window CFR gain filter configured to generate a gain correction ($F_k$) based on the scaling factor and the filter length; a delay configured to delay the input signal ($x_k$) to generate a delayed input signal; a multiplier configured to multiply the gain correction ($F_k$) by the delayed input signal to obtain a peak correction value; and an adder configured to determine an output signal ($y_k$) based on the peak correction value and the delayed input signal.

A method for crest factor reduction (CFR) includes receiving an input signal ($x_k$) by a peak detector; generating, using a running maximum filter, a scaling factor based on a window gain ($G_k$) and a filter length, wherein the window gain ($G_k$) is based on the input signal ($x_k$) and a threshold value (T); generating, using a window CFR gain filter, a gain correction ($F_k$) based on the scaling factor and the filter length; delaying, by a delay, the input signal ($x_k$) to obtain a delayed input signal; multiplying, using a multiplier, the gain correction ($F_k$) by the delayed input signal to obtain a peak correction value; and adding the peak correction value to the delayed input signal to obtain an output signal ($y_k$).

A system for crest factor reduction (CFR) includes a peak detector configured to receive an input signal; a first peak cancellation crest factor reduction (PCCFR) module coupled to the peak detector; and a window CFR module coupled to the first PCCFR module. The first PCCFR module is configured to remove a first set of one or more peaks in the input signal, and the window CFR module is configured to remove one or more additional peaks in the input signal after the first PCCFR module has removed the first set of one or more peaks in the input signal.

The features, functions, and advantages can be achieved independently in various cases or may be combined in other cases.

Other and further aspects and features will be evident from reading the following detailed description.

BRIEF DESCRIPTION OF THE DRAWINGS

These and other features, aspects, and advantages of the present disclosure will become better understood with regard to the following description, appended claims, and accompanying drawings, in which:

FIG. 2-1 illustrates a system that includes a CFR processor.

FIG. 2-2 illustrates an example of a window CFR processor.

FIG. 2-3 illustrates a method performed by the system of FIG. 2-1 with the window CFR processor of FIG. 2-2.

FIG. 3 illustrates an example of a running maximum filter.

FIG. 4-1 is a graph illustrating signal values associated with the method of FIG. 2-3.

FIG. 4-2 illustrates formulas that may be utilized by, or that may govern the operation of, the system of FIG. 2-1.

FIG. 5-1 illustrates a PCCFR processor.

FIG. 5-2 illustrates another PCCFR processor that includes a plurality of cancellation pulse generators (CPGs).

FIG. 6-1 illustrates an example of a peak detector.

FIG. 6-2 illustrates an example of an interpolator.

FIGS. 6-3 and 6-4 illustrate a method for peak detection in CFR.

DETAILED DESCRIPTION

Figure 1:
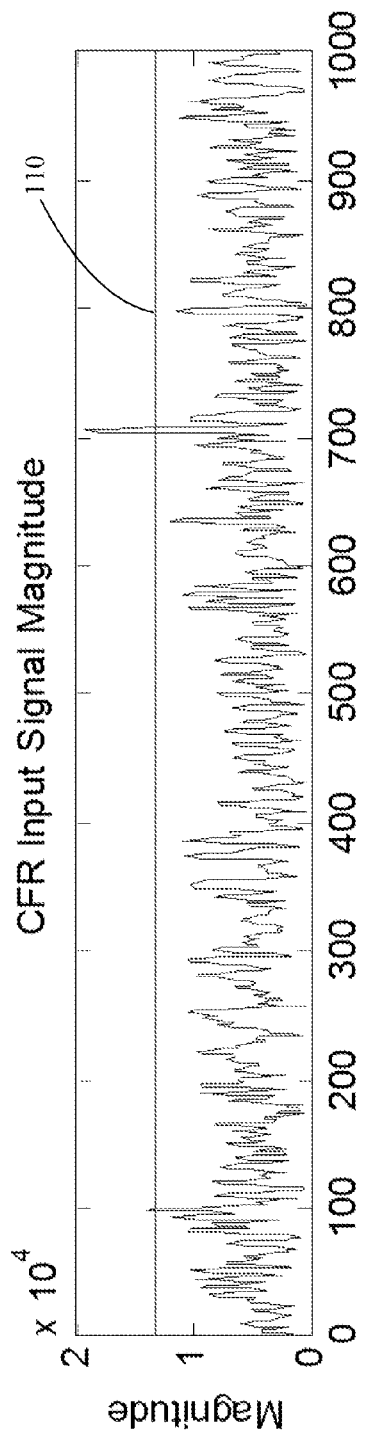
FIGS. 1-1 to 1-3 are graphs that illustrate a peak cancellation crest factor reduction (PCCFR) process in time domain.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated feature needs not have all the aspects or advantages shown. An aspect or an advantage described in conjunction with a particular feature is not necessarily limited to that feature, and can be practiced in any other features even if not so illustrated or if not so explicitly described.

The methods and apparatus disclosed herein provide an efficient window crest factor reduction (CFR), and peak detection in CFR.

The disclosed system includes a peak detector for accurately locating and measuring peak values in CFR. The peak detector limits the amount of oversampling by performing a polynomial fit (e.g., a quadratic fit) to the signal magnitude, and then extracting the peak location. From the quadratic fit, the peak location may be used to compute the magnitude of the signal at that location as if the peak had been found with a much higher sampling rate.

In some cases, the disclosed system may utilize window CFR. The advantage of utilizing window CFR is that it prevents peaks from being missed in the detection, and also prevents new peaks from occurring at the output. A disadvantage of using window CFR is that the performance (which may be measured by metrics such as error vector magnitude (EVM) versus peak-to-average ratio (PAR) may not be as good as the PCCFR method. However, the combination of using PCCFR and window CFR provides a good compromise in terms of complexity and performance. If the PCCFR eliminates most of the peaks with a good EVM, then the window CFR may be used to "clean up" the remaining peaks. If there are few remaining peaks, the degradation by using window CFR compared to using more stages of PCCFR is very small. As such, in some cases, window CFR may be used as a post processing after one or more PCCFR stages.

The system and methods also provides peak cancellation that reduces peaks (e.g., to an average power ratio of a signal) by subtracting spectrally-shaped pulses from the signal peaks that exceed a specified threshold. Cancellation pulses (CP) provided by the system and method are designed to have a spectrum that matches that of the input signal. Therefore the cancellation pulses introduce negligible out-of-band interference. In some cases, the input signal and cancellation pulses are complex, and the peak search may be carried out on the signal magnitude. Because the signals are complex, each cancellation pulse may be rotated to match the phase of the corresponding peak. The peak magnitude of a given cancellation pulse (CP) may be set equal to the difference between the corresponding signal peak magnitude and a desired clipping threshold. The disclosed method reduces the peak signal magnitudes to the threshold value while preserving the signal phase.

Figures 1, 2:
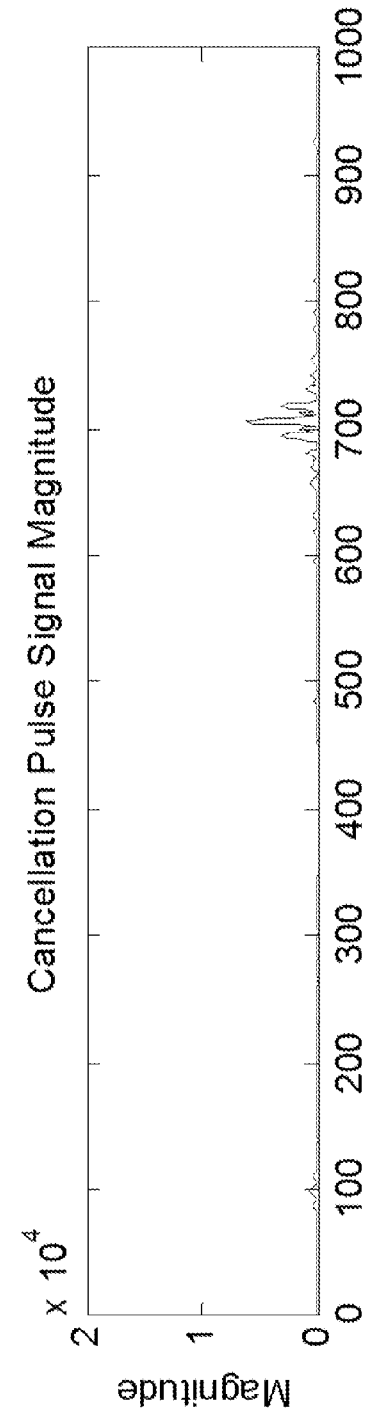
Figures 1, 2, 3:
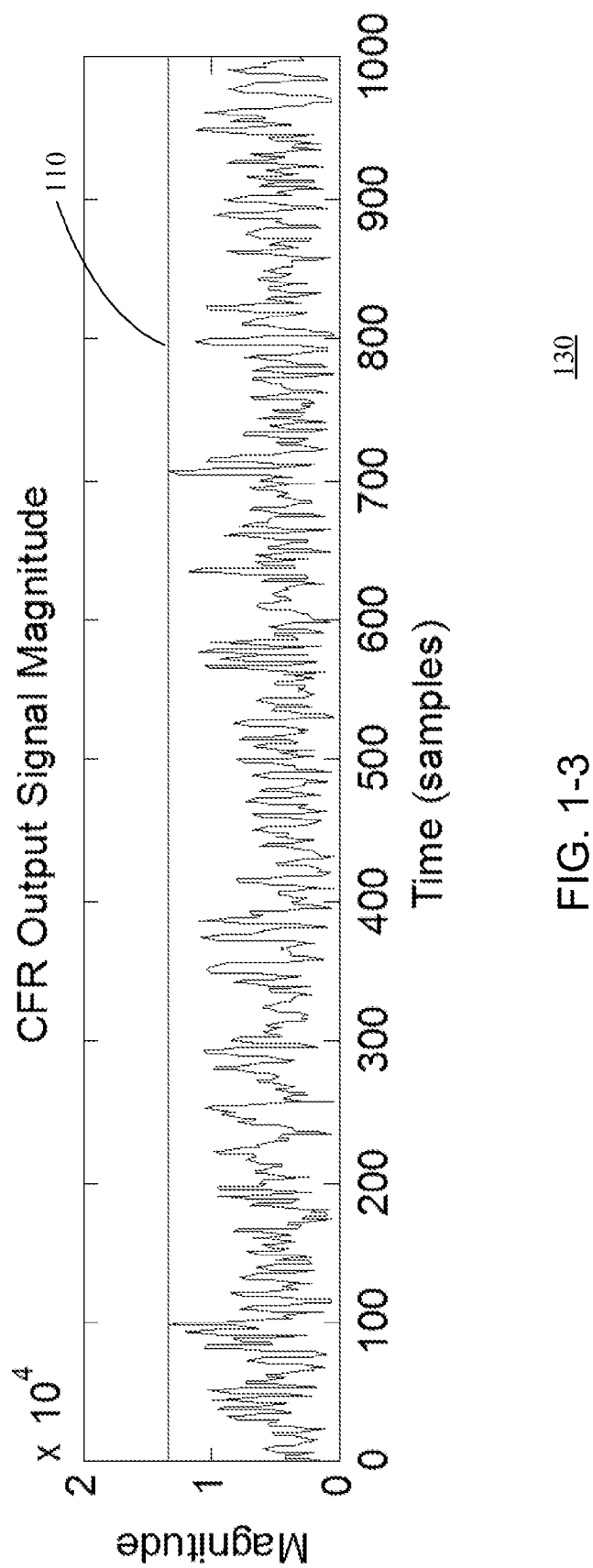
Figures 1, 2:
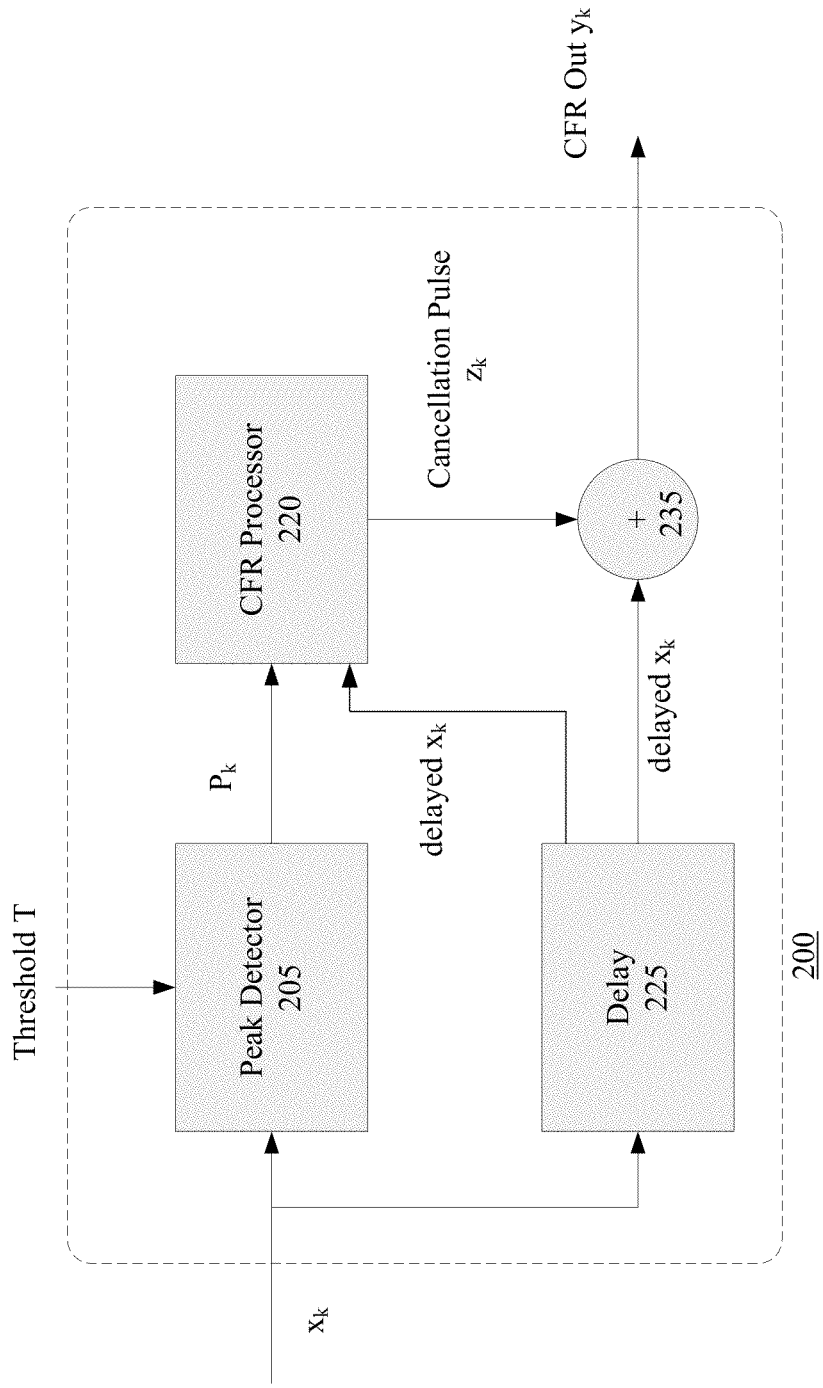
Figure 2:
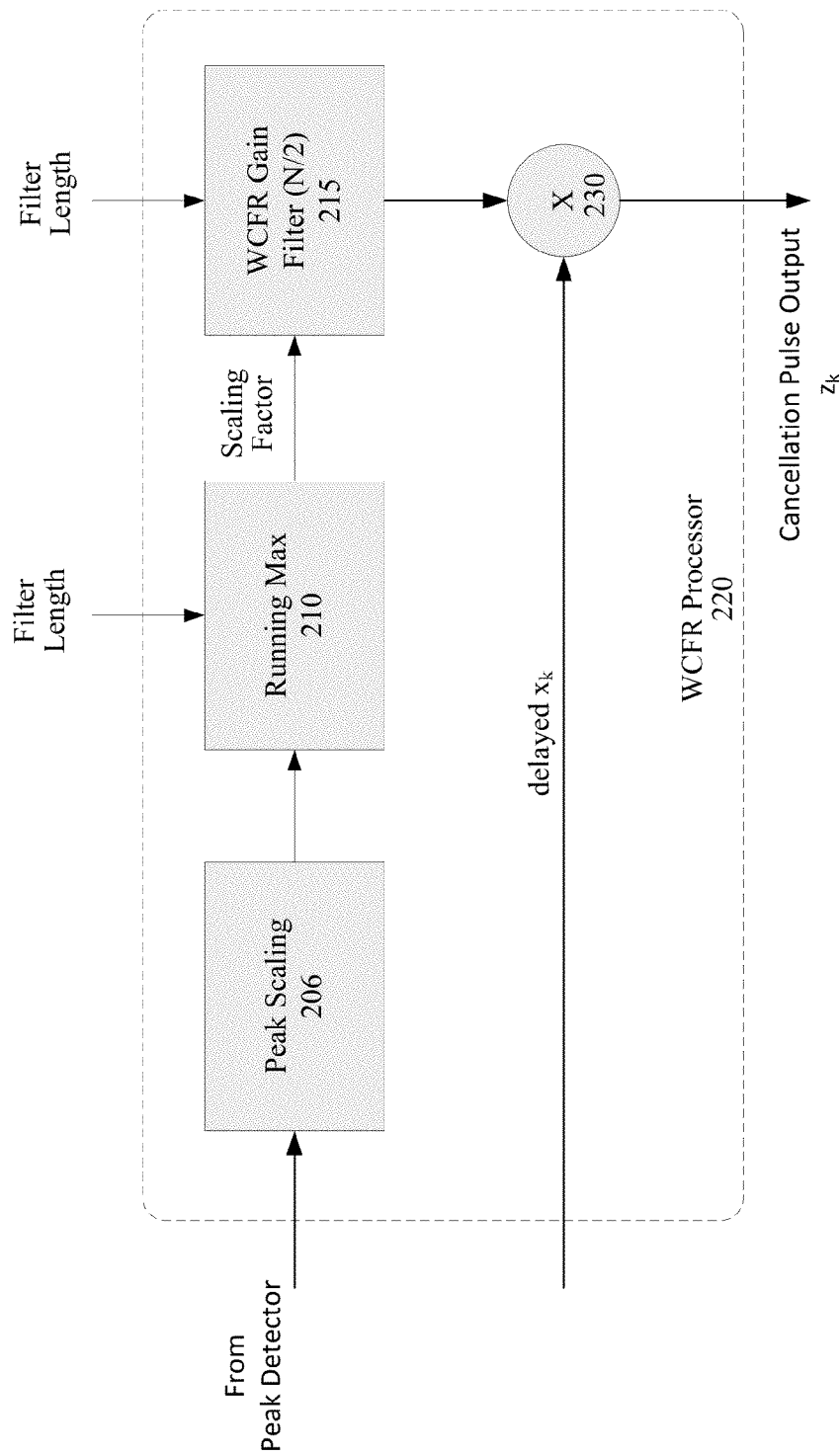
Figures 2, 3:
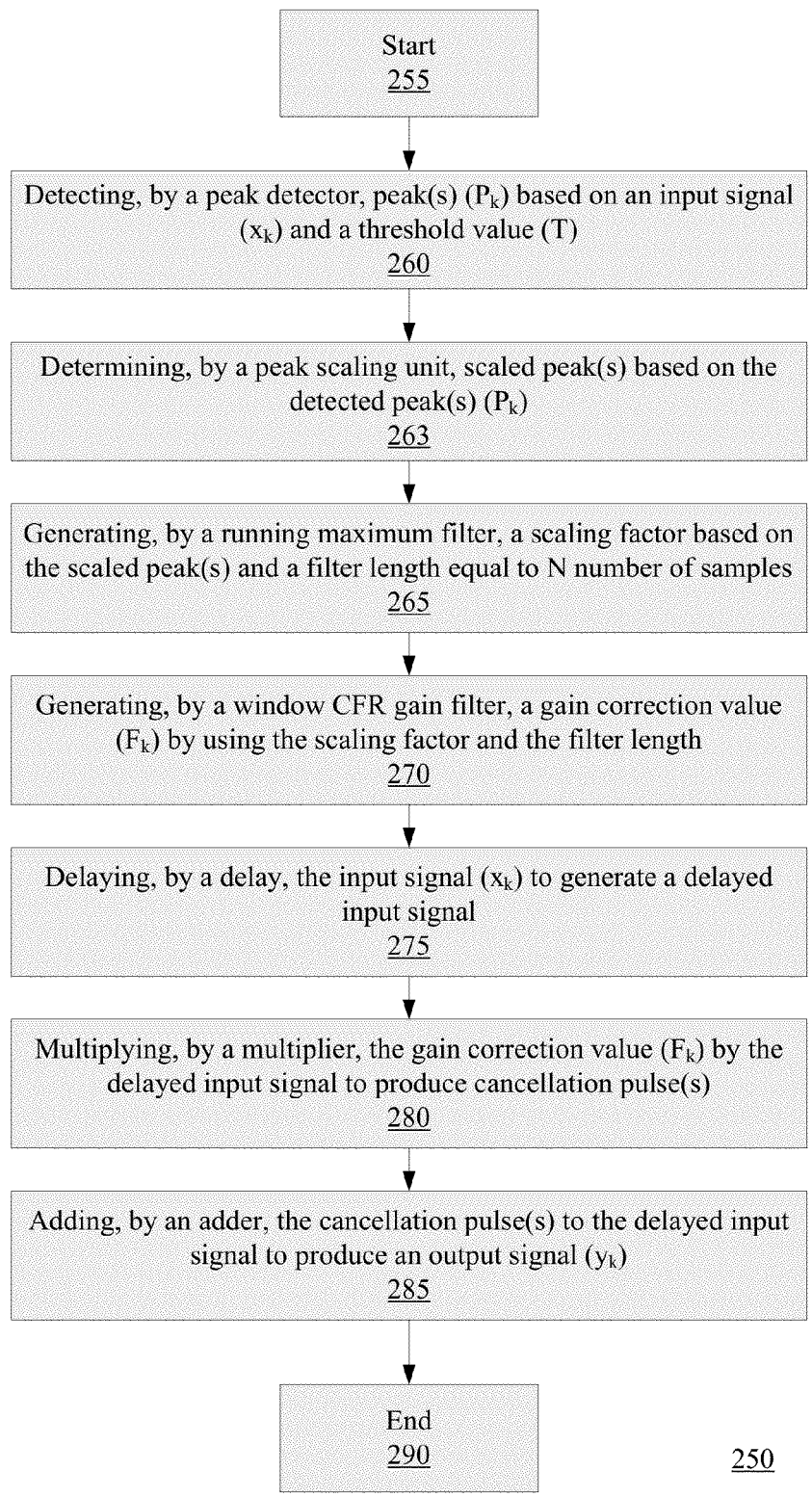
Figure 3:
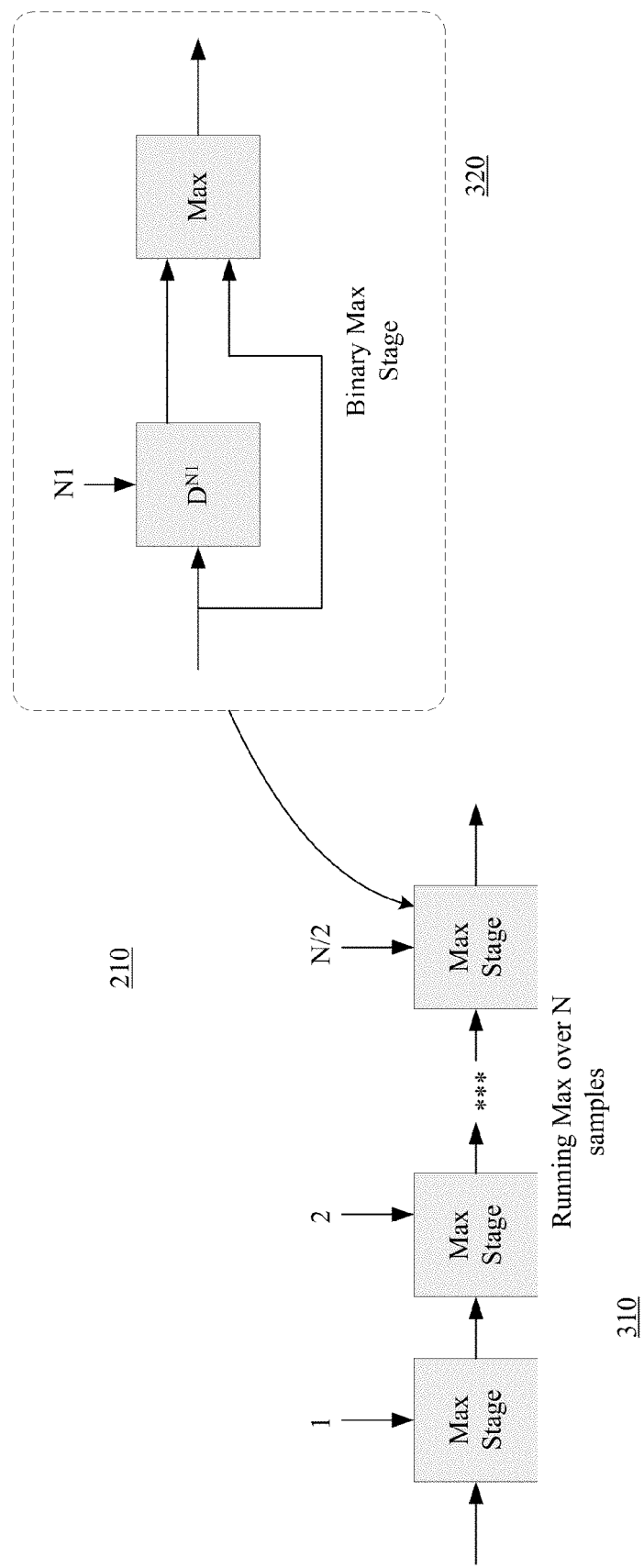

FIGS. 1-1 to 1-3 illustrate peak cancellation crest factor reduction (PCCFR) process in the time domain. In particular, FIG. 1-1 is a graph 100 depicting a section of an input signal with varying magnitudes. The horizontal axis of the graph 100 represents time, and the vertical axis of the graph 100 represents magnitude of the input signal. A horizontal line 110 is shown in the graph 100, indicates a clipping threshold. Any peak that exceeds this threshold is a candidate for peak cancellation. The clipping threshold may be arbitrarily set, and may have different values in different cases. FIG. 1-2 is a graph 120 illustrating magnitude of a cancellation pulse (located at around time=700) that is to be subtracted from the input signal. FIG. 1-3 is a graph 130 illustrating magnitude of an output signal that is obtained after subtracting the cancellation pulse in FIG. 1-2 from the input signal in FIG. 1-1. As shown in FIG. 1-3, the output signal is the same as the input signal except that the peak (located at around time=700) in the input signal has been cancelled.

FIG. 2-1 illustrates a system 200 for CFR. In some cases, the system 200 may provide cancellation pulses and PCCFR. The system 200 includes a peak detector 205, a CFR processor 220 coupled to the peak detector 205, a delay 225, and an adder 235.

The peak detector 205 is configured to receive an input signal ($x_k$) and a threshold value (T). The threshold value (T) is a predetermined value that represents a clipping threshold for peak cancellation. For example, the threshold value (T) is set to be equal to 2.0. However, in other examples, the threshold value (T) may be higher than 2.0, or less than 2.0. The peak detector 205 is also configured to identify peaks ($P_k$) based on (e.g., using) the input signal ($x_k$) and the threshold value (T). In some cases, the peak detector 205 may be implemented using any known peak detector. In other cases, the peak detector 205 may be a new peak detector. A new peak detector will be described with reference to FIG. 6-1.

The delay 225 is configured to receive the input signal ($x_k$), and delay the input signal ($x_k$) to generate a delayed input signal. The CFR processor 220 is configured to receive the identified peak(s) ($P_k$) from the peak detector 205, and the delayed input signal ($x_k$) from the delay 225, and output cancellation pulse(s) ($Z_k$) based on the identified peak(s) ($P_k$) and the delayed input signal ($x_k$).

The delay 225 is also configured to pass the delayed input signal ($x_k$) to the adder 235. The adder 235 is configured to add the cancellation pulse(s) ($Z_k$) to the delayed input signal ($x_k$) to thereby subtract unwanted peak(s) from the input signal ($x_k$) to produce an output signal ($y_k$), which is a gain corrected output signal. In some cases, the cancellation pulse(s) ($Z_k$) may have a negative value with respect to the input signal ($x_k$). Thus, when the adder 235 adds the cancellation pulse ($Z_k$) to the delayed input signal ($x_k$), the cancellation pulse(s) ($Z_k$) is effectively "subtracted" from the delayed input signal ($x_k$).

In some cases, the CFR processor 220 may be implemented using a window CFR processor that provides window filtering. FIG. 2-2 illustrates an example of a window CFR processor 220. The window CFR processor 220 will be described with reference to the system of FIG. 2-1. However, it should be understood that the window CFR processor 220 may be used with other systems in other embodiments. The window CFR processor 220 includes a peak scaling unit 206, a running maximum filter 210, a window CFR gain filter 215, and a multiplier 230.

The peak scaling unit 206 is configured to receive identified peaks ($P_k$) from the peak detector 205, and determine a difference between the peak magnitudes and a clipping threshold (e.g., by performing a subtraction function) to output scaled peaks. In some cases, the peak scaling unit 206 may provide an output that is equal to $1-1/\sqrt{P_k/T^2}$. Also, in some cases, the window CFR processor 220 may not include the peak scaling unit 206. In such cases, the peak scaling unit 206 may be incorporated into the peak detector 205 of FIG. 2-1.

The running maximum filter 210 is configured to receive the scaled peaks from the peak scaling unit 206, and a filter length. The filter length may be set equal to N samples, where N is an integer. The running maximum filter 210 is also configured to generate a scaling factor based on (e.g., using) the scaled peaks and the filter length. In one implementation, the running maximum filter 210 may be configured to generate the scaling factor by determining a maximum gain of a window gain ($G_k$) over the filter length (e.g., over N samples). FIG. 3 illustrates an example of a running maximum filter 310, which may be used to implement the running maximum filter 210 of the window CFR processor of FIG. 2-2. The running maximum filter 310 is configured to operate over the window filter length of N samples. In some cases, the length N may be a power of two. In other cases, the length N may be other numbers. As shown in the figure, the running maximum filter 310 has a number of stages. Each stage may be a binary maximum stage having the configuration 320 shown in the figure. Such configuration allows the running maximum filter 210 to generate a scaling factor more efficiently than a direct approach. In other cases, each stage may have other configurations. During use, the signal maximum is determined at each stage, and the running maximum accumulates as each stage passes the running maximum value to the next stage. For example, if N=7 and assuming the input signals (samples) are 3, 3, 4, 2, 5, 7, 1, then the running maximum is 3, 3, 4, 4, 5, 7, 7.

Returning to FIG. 2-2, the window CFR gain filter 215 is configured to receive the scaling factor from the running maximum filter 210 and the filter length, and generate a gain correction ($F_k$) based on (e.g., using) the scaling factor from the running maximum filter 210 and the filter length. In some cases, a Hanning window filter or a Blackman window filter may be employed to implement the window CFR gain filter 215. Also, in some cases, the window CFR gain filter 215 may be centered at N/2, wherein N is the number of samples that corresponds to the filter length.

The multiplier 230 is configured to receive a delayed input signal ($x_k$) from the delay 225 of the system 200 of FIG. 2-1. The multiplier 230 is configured to multiply the gain correction ($F_k$) from the window CFR gain filter 215 by the delayed input signal to produce cancellation pulse(s) ($z_k$). In some cases, the cancellation pulse(s) ($z_k$) may be considered a peak correction value.

In some cases, the window CFR processor 220 of FIG. 2-2 may be implemented using at least one field programmable gate array (FPGA). For example, in some cases, a FPGA may be configured to implement the peak scaling unit 206, the running maximum filter 210, the window CFR gain filter 215, the multiplier 230, or any combination of the foregoing. In other cases, the window CFR processor 220 may be implemented using any integrated circuit, such as a general purpose processor, an ASIC processor, a microprocessor, or other types of processor. In further cases, the window CFR processor 220 may be implemented using hardware, software, or a combination of both.

Also, in some cases, the system 200 of FIG. 2-1 may be implemented using at least one FPGA. For example, in some cases, a FPGA may be configured to implement the peak detector 205, the CFR processor 215, the delay 225, and the adder 235. In other cases, the system 200 may be implemented using any integrated circuit, such as a general purpose processor, an ASIC processor, a microprocessor, or other types of processor. In further cases, the system 200 may be implemented using hardware, software, or a combination of both.

FIG. 2-3 illustrates a method 250 performed by the system 200 of FIG. 2-1, with the CFR processor 220 of FIG. 2-1 being the window CFR processor 220 of FIG. 2-2. At item 255, the method begins. A peak detector detects peak(s) ($P_k$) based on an input signal ($x_k$) and a threshold value (T) (item 260). In some cases, item 260 may be performed by the peak detector 205 in the system 200 of FIG. 2-1.

Next, a peak scaling unit receives the detected peak(s) ($P_k$) and output scaled peak(s) based on the detected peak(s) (item 263). In some cases, item 263 may be performed by the peak scaling unit 206 in the window CFR processor 220 of FIG. 2-2.

Next, a running maximum filter then generates a scaling factor based on the scaled peaks and a filter length equal to N samples (item 265). In some cases, item 265 may be performed by the running maximum filter 210 in the window CFR processor 220 of FIG. 2-2.

Next, a window CFR gain filter then generates a gain correction ($F_k$) based on the scaling factor and the filter length (item 270). In some cases, item 270 may be performed by the window CFR gain filter 215 in the window CFR processor 220 of FIG. 2-2.

Next, a delay delays the input signal ($x_k$) to generate a delayed input signal (item 275). In some cases, item 275 may be performed by the delay 225 in the system 200 of FIG. 2-1.

Next, a multiplier multiplies the gain correction ($F_k$) by the delayed input signal to produce cancellation pulse(s) (item 280). In some cases, item 280 may be performed by the multiplier 230 in the window CFR processor of FIG. 2-2.

Next, an adder then adds the cancellation pulse(s) from the delayed input signal to produce an output signal ($y_k$) (item 285). In the output signal ($y_k$), unwanted peak(s) are removed by the cancellation pulse(s). In some cases, item 285 may be performed by the adder 235 in the system 200 of FIG. 2-1. Then, the method 250 ends at item 290.

Figures 1, 4:
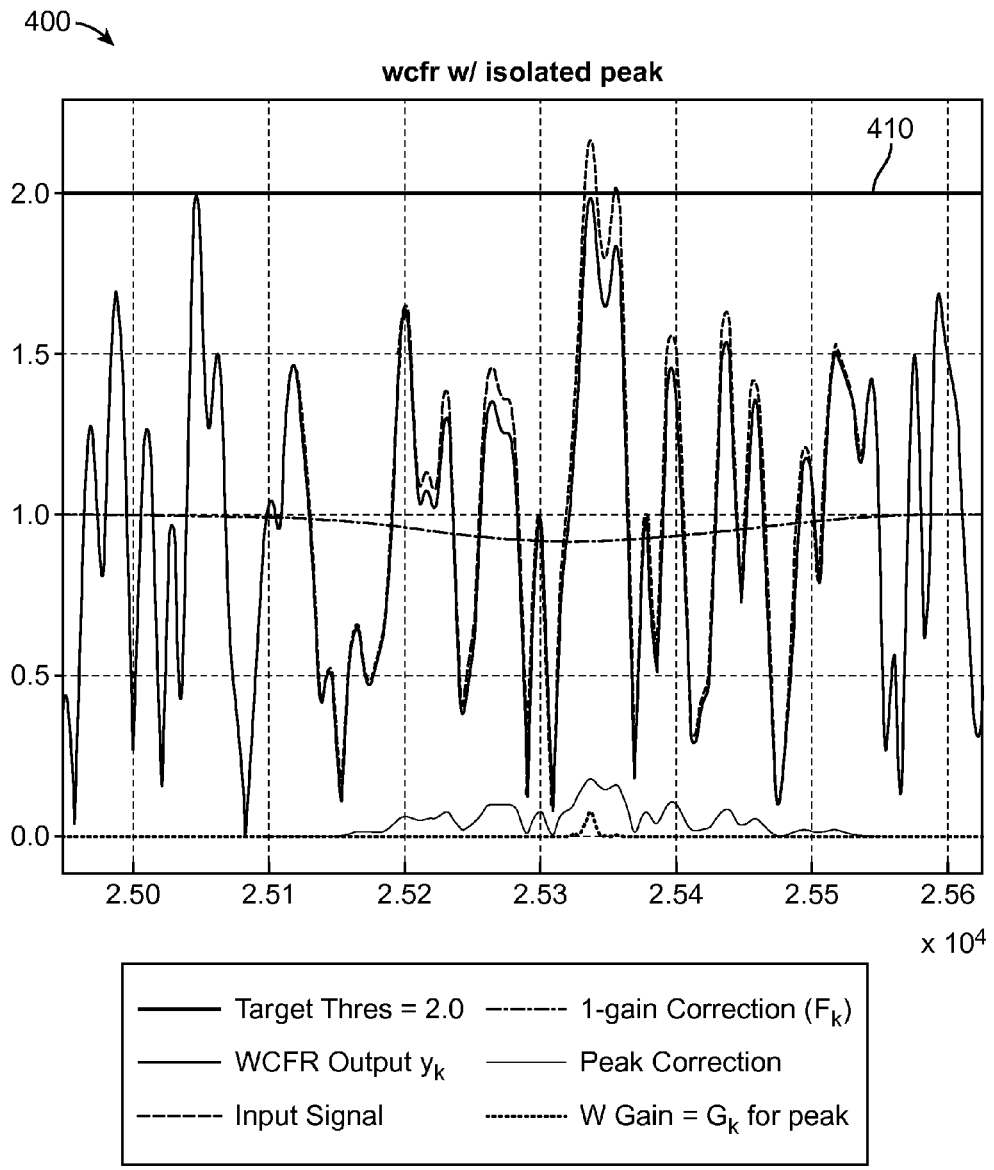

FIG. 4-1 is a graph 400 illustrating an example of an input signal and examples of various signal values involved in the method 250 of FIG. 2-3. The signal values may be generated by components of the system 200 of FIG. 2-1, and/or may be derived from output of the components of the system 200 of FIG. 2-1. In the graph 400, the horizontal axis represents time, and the vertical axis represents scaled signal strength (e.g., volts). A horizontal line 410 represents a threshold (T), which dictates the maximum allowable signal. In the illustrated example, the threshold (T) is 2.0. In other examples, the threshold (T) may be more than 2.0 or less than 2.0. The graph 400 includes an example of a time history of an input signal ($x_k$), which may be an example of the input signal ($x_k$) received by the peak detector 205 in item 260 of the method 250. The graph 400 also shows a window gain ($G_k$), which may be determined by the window CFR gain filter 215 of the window CFR processor 220. In addition, the graph 400 also shows a peak correction, which may be an example of the cancellation pulse output by the multiplier 230 in item 280 of the method 250. Furthermore, the graph 400 shows an applied window CFR gain, which is 1−gain correction ($F_k$). Such parameter, when multiplied by the delayed signal ($x_k$), results in the output signal ($y_k$) because $x_k - x_k * F_k$ represents the operation performed by the multiplier 230 and the adder 235 in the system 200. In the illustrated example, the amplitude of the gain correction ($F_k$) is determined based at least in part on the window gain ($G_k$), which is applied at the center of the running maximum filter at N/2. The window gain ($G_k$) is a smooth function to maintain the gain corrected window CFR output signal ($y_k$) within a spectral band. The graph 400 also shows an example of the output signal ($y_k$), which may be an example of the output signal ($y_k$) output by the adder 235 in item 285 of the method 250. The resulting difference between the input signal ($x_k$) and corrected window CFR output signal ($y_k$) is the peak correction, which occurs over a time interval due to the gradual application of the window gain ($G_k$).

FIG. 4-2 illustrates formulas that may be utilized by, or that may govern the operation of, the system 200 of FIG. 1-2. In the formulas, (A) represents the peak signal, or the squared value of the signal at the peak, (T) represents the target threshold, and (W) represents the window filter provided by the combination of the running maximum filter 210 and the window CFR gain filter 215. As shown in the figure, the squared magnitude of the peak amplitude is scaled by the threshold (T) and, from these values, the gain ($G_k$) at the peak is computed. After the threshold scaling, all other processing by the window CFR processor 220 does not require knowledge of the threshold (T).

Various techniques may be employed to implement the window filter W. In some cases, the window length for the window filter W may be on the order of 256 samples. In other cases, the window length for the window filter W may have other lengths. In some cases, a Hanning window may be used to implement the window filter W. For example, the Hanning window may be:

$$w_n = \frac{1 + \cos(2\pi n/(N-1))}{2} \quad -\frac{N}{2} \leq n \leq \frac{N}{2}$$

In some cases, the Hanning window may be expressed as two factors:

$$w_n = w1_n * w2_n$$

where $$W_1 = \begin{cases} 1 & -N/4 \leq n \leq N/4 \\ 0 & \text{otherwise} \end{cases}$$

$$W_2 = \begin{cases} \cos(2\pi n/(N-1)) & -N/4 \leq n \leq N/4 \\ 0 & \text{otherwise} \end{cases}$$

In some cases, the $W_1$ factor may be implemented with a single stage CIC filter to obtain a box car response. The $W_2$ factor may be implemented using a normal shift register and multiplier array. In other cases, the $W_2$ factor may be implemented using CIC filters or other filters that resembles CIC filters.

Also, in some cases, for a Hanning window having length N, the $W_1$ factor may have a length of N/2. The total length of the $W_2$ factor may also be N/2 and a close approximation may be determined as:

$$\hat{W}_2 = U_1 * U_2 * U_3 / ((N+1)/3)$$

Where $$U_i(k) = \begin{cases} 1 & 0 \leq k \leq (N+1)/3 - 1 \\ 0 & \text{otherwise} \end{cases}$$

$$U_2(k) = \begin{cases} 1 & 0 \leq k \leq (N+1)/6 - 1 \\ 0 & \text{otherwise} \end{cases}$$

$$U_3(k) = [1 \quad 1]$$

Length $\hat{W}_2 = (N+1)/2$

The $U_3$ term is used to force the length of the Hanning filter to be odd so that the filter peak can be aligned with the signal peak exactly.

In some cases, for the operation of the window CFR processor 220, a selection of lengths $U_1$, $U_2$ that are different by factors of two is sufficient for the size resolution needed. To simplify the implementation of the window CFR processor 220, it may be advantageous if the lengths of the $U_1$, $U_2$ filters are powers of two, and the overall length N is odd. In some cases, the filter length N may be determined as:

$$N = 3 \cdot 2^m - 1$$

In this case the lengths of $U_1$ and $U_2$ are both powers of two, and the gain (N+1)/3 is also a power of two. The $W_1$ and $W_2$ factors length are three times a power of two. In other cases, the filter length N may be determined based on other equations and/or considerations. Also, in other cases, the lengths of the $U_1$, $U_2$ filters may be powers of other numbers that are different from two.

In some cases, the above filtering technique may be adjusted to address overlapping peaks. The above algorithm works well when the peaks are isolated. However if peaks overlap, then the gain correction may be superimposed on the correction gain. This may result in a reduction in the performance of the window CFR processor 220. A modification of the algorithm may be employed where the over cancellation is eliminated. From the factorization of the filter, it is noted that when the peaks do not overlap, a running maximum filter of the gains computed at the peaks may replace the $W_1$ filtering step. When the peaks overlap, the smaller peaks are shadowed by the running maximum, effectively eliminating them from consideration and therefore eliminates the over cancellation issue. In some cases, the modified algorithm may be as follows:

$$g_k = 1 - 1/\sqrt{A/T^2}$$

$$M_{k,N} = \{m \in G_N : m \geq a \, \forall a \in G_N\}$$

$$G_N = \{g_k : \forall |k - N| \leq M\}$$

$$F_k = M_k * W_2 = M_k * U_1 * U_2 * U_3$$

$$y_k = x_k - F_k * x_k$$

where $g_k$ is the gain, and A is the peak value or a square of the peak value. Based on the above equations, the running maximum may be computed nearly as efficiently as a box car impulse response, but solves the overlapping peak issue.

Figures 1, 2, 4, 5:
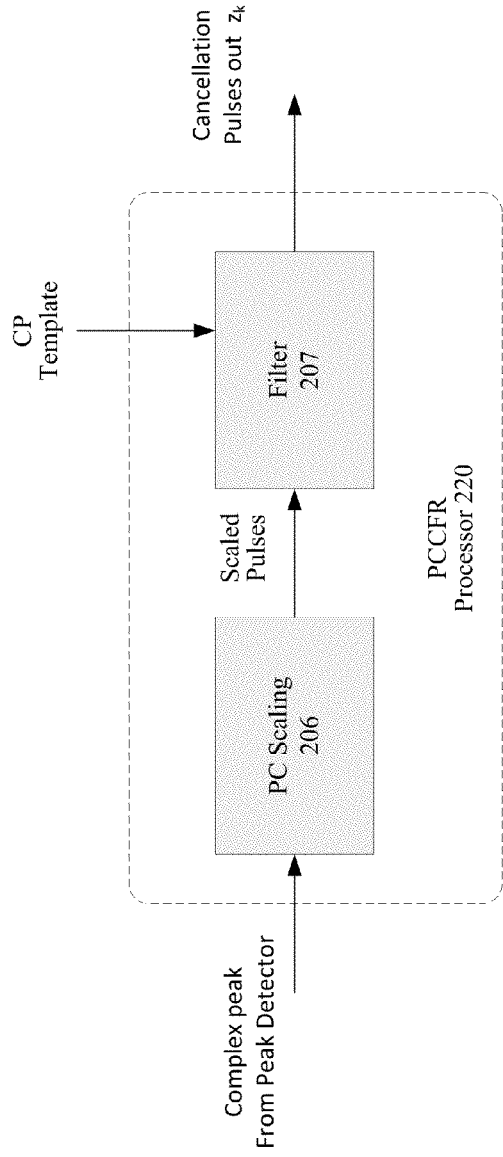
Figures 2, 5:
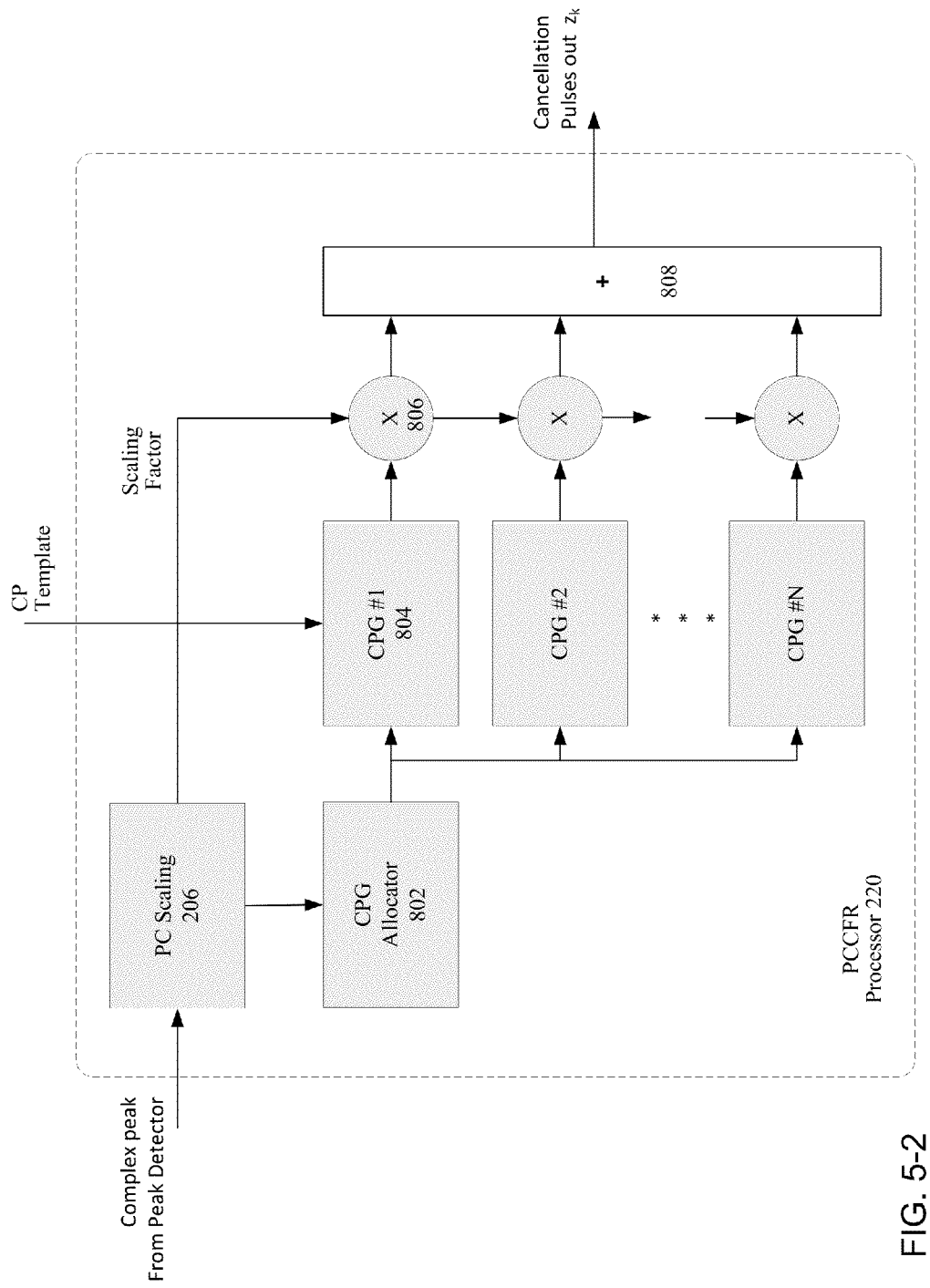

In some cases, cancellation pulse $z_k$ may be achieved using a PCCFR processor instead of a window CFR processor. FIG. 5-1 illustrates an example of a PCCFR processor 220. The PCCFR processor 220 may be an example of the CFR processor 220 in the system 200 of FIG. 2-1. The PCCFR processor 220 includes a peak cancellation (PC) scaling unit 206 and a filter 207 (e.g., a digital filter) coupled to the peak scaling unit 206. The PCCFR processor 220 is coupled to a peak detector (such as the peak detector 205 of FIG. 2-1), and is configured to receive input, such as peak information, from the peak detector. The peak scaling unit 206 is configured to scale the input from the peak detector and generate a scaled output/peak (which may be considered a gain). In some cases, the PCCFR processor 220 may not include the peak scaling unit 206. In such cases, the peak scaling unit 206 may be incorporated into the peak detector 205 of FIG. 2-1. The filter 207 is configured to receive the scaled output, and generate cancellation pulses $z_k$ based on the scaled output and a cancellation pulse (CP) template. The CP template is a template that defines a standard cancellation pulse. In some cases, the cancellation pulse may be stored in a table (memory). When a peak is found, an index is set to the beginning of the table. Each table output representing a point on the cancellation pulse may then be scaled by the gain computed. For each subsequent sample time, the table index may be incremented and scaled by the same constant. After the entire table is read, the index may be reset. In some cases the peak detector for providing input to the PCCFR processor 220 may be any known peak detector. In other cases, the peak detector may be any of the peak detectors described herein.

In some cases, a PCCFR processor may be implemented using cancellation pulse generators (CPGs). FIG. 5-2 illustrates an example of another PCCFR processor 220 that includes a plurality of cancellation pulse generators (CPGs). The PCCFR processor 220 may be an example of the CFR processor 220 in the system 200 of FIG. 2-1. The PCCFR processor 220 includes a peak scaling unit 206, a CPG allocator 802 coupled to the peak scaling unit 206, and a plurality of CPGs 804 coupled to receive input from the CPG allocator 802. The PCCFR processor 220 also includes multipliers 806 coupled to respective CPGs 804, and an adder 808 coupled to receive input from the multipliers 806.

The allocator 802 is configured to control the assignment of CPG resources to perform the task of canceling incoming peaks. During start-up, all CPGs 804 are available. When the first peak arrives, the allocator 802 assigns the first CPG 804 to cancel it, and then tags that CPG 804 as being allocated. When allocated, a CPG 804 becomes unavailable for the length of the cancellation pulse (in samples). When subsequent peaks arrive, the allocator 802 steps through the status of each CPG 804 and assigns the first one available. In some cases, peaks that arrive when all CPGs 804 are currently busy do not get cancelled and will be picked up by a subsequent iteration of the algorithm. Such may happen when the input signal exhibits a high density of over-threshold peaks in clusters.

During use, the PCCFR processor 220 receives input from a peak detector (such as the peak detector 205). The input from the peak detector may be peak information, such as a peak location indicator, peak magnitude, phase information for the peak(s), or any combination of the foregoing. In some cases, the peak scaling unit 206 may be configured to determine a difference between the peak magnitudes and the clipping threshold (e.g., by performing a subtraction function). The magnitude difference may be combined with the phase information to produce a complex weighting for scaling cancellation pulse.

As shown in FIG. 2-5, the PC scaling unit 206 provides a scaling factor to the multiplier 806 that corresponds to the first CPG 804. The multiplier 806 also receives input from the first CPG 804, and multiplies the input from the first CPG 804 with the scaling factor to generate a first multiplier output. The first multiplier output is input to the adder 808. Similar operations are performed by additional CPG(s) 804 and corresponding multiplier(s) 806, and output from the multiplier(s) 806 is input to the adder 808. In some cases, each multiplier 806 is configured to scale the cancellation pulse to match the peak found. The cancellation pulse stored in the CPG 804 is scaled to 1 so that the peak amplitude required by the CPG to cancel the peak can be directly applied to the CPG output. In some cases, the PCCFR processor 220 may not include the peak scaling unit 206. In such cases, the peak scaling unit 206 may be incorporated into the peak detector 205 of FIG. 2-1.

The adder 808 adds the multiplier outputs from the CPGs 804 to obtain cancellation pulse(s) $z_k$. In particular, the outputs from the CPGs 804 are summed for the completed cancellation waveform to be applied to the input signal in order to cancel the peak(s).

In some cases, the CPGs 804 may be configured to generate cancellation pulses independently followed by scaling and subtraction from the incoming data samples. Each CPG 804 applies a separate cancellation pulse $c_n$ to the incoming signal. In some cases, the CPGs 804 may be configured to process incoming samples independently based on the following equations:

$$\hat{y}_n = x_n - \alpha_{N_0} c_{n-N_0}$$

$$\alpha_{N_0} = (|x_{N_0}| - T)e^{j\phi_{N_0}}, \phi_{N_0} = \angle x_{N_0}$$

where $x_n$ is input and $\hat{y}_n$ is output due to peak cancellation by one CPG 804. The peak to be cancelled is assumed to be at n=$N_0$. As shown in the above equations, the output due to peak cancellation may be obtained by subtracting a scaled cancellation pulse from the input, wherein c is the cancellation pulse, and α is the scaling factor. α is a function of the threshold T and the ø is the phase of $x_n$. In other cases, the CPGs 804 may be configured to process incoming samples based on the following equations:

$$\hat{y}_n = x_n - (G_n x_{n+\text{off}}) c_{n-N_0}$$

$$G_n = \begin{cases} 1/\sqrt{|x_{n+\text{off}}/T|^2} & |x_{n+\text{off}}/T|^2 > 1 \\ 0 & \text{Otherwise} \end{cases}$$

where, $x_n$ is input and $\hat{y}_n$ is output due to peak cancellation by one CPG 804. The peak to be cancelled is assumed to be at n=$N_0$, and $X_{n+\text{off}}$ is a fractional peak with quadratic interpolation. As shown in the above equations, the output due to peak cancellation is obtained by subtracting a scaled cancellation pulse from the input, wherein c is the cancellation pulse, and G*x is the scaling factor. Note that G is a function of the desired threshold T.

In some cases, the number of CPGs 804 corresponds to a number of consecutive peaks that may be canceled on an incoming sample. Thus, with eight CPGs 804 for example, a maximum of eight consecutive peaks may be cancelled on incoming samples. These operations may be made iterative. For example, in some cases, another set of four, or other numbers of, CPGs 804 may be employed on the samples coming out of the first set of CPGs 804. In some cases, the PCCFR processor 220 may provide a maximum of eight iterations, and each iteration may have a maximum of twelve CPGs 804. In other cases, the number of iterations may be less than eight, or more than eight. Also, in other cases, the maximum number of CPGs 804 in each iteration may be less than twelve, or more than twelve.

Figures 1, 6:
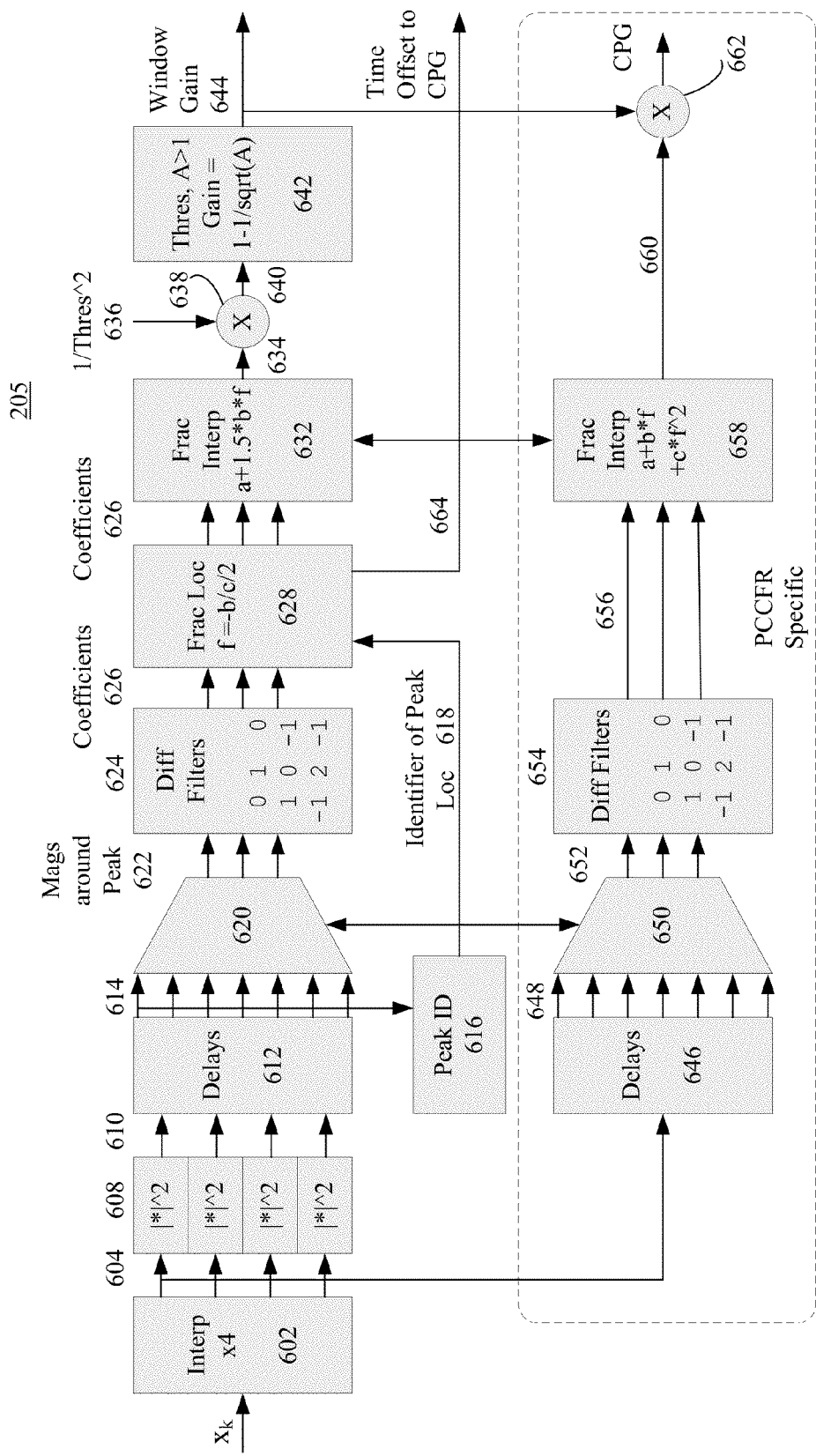
Figures 2, 6:
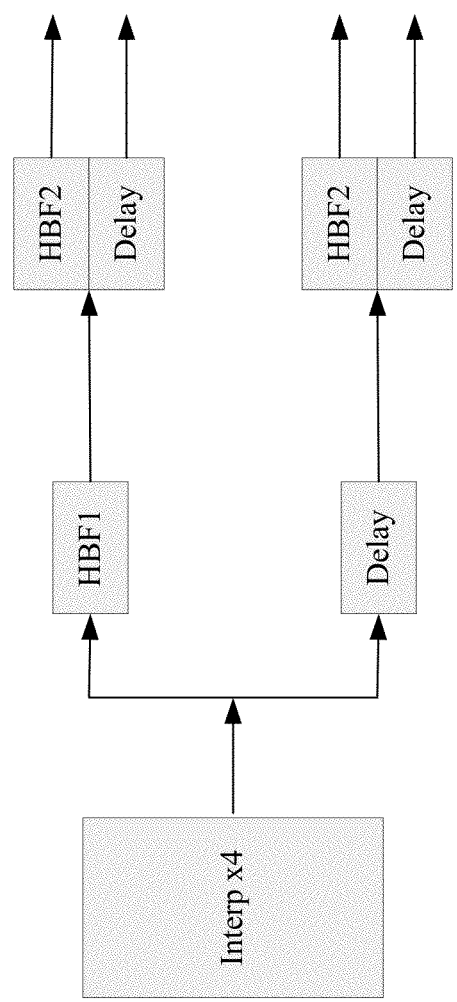
Figures 3, 6:
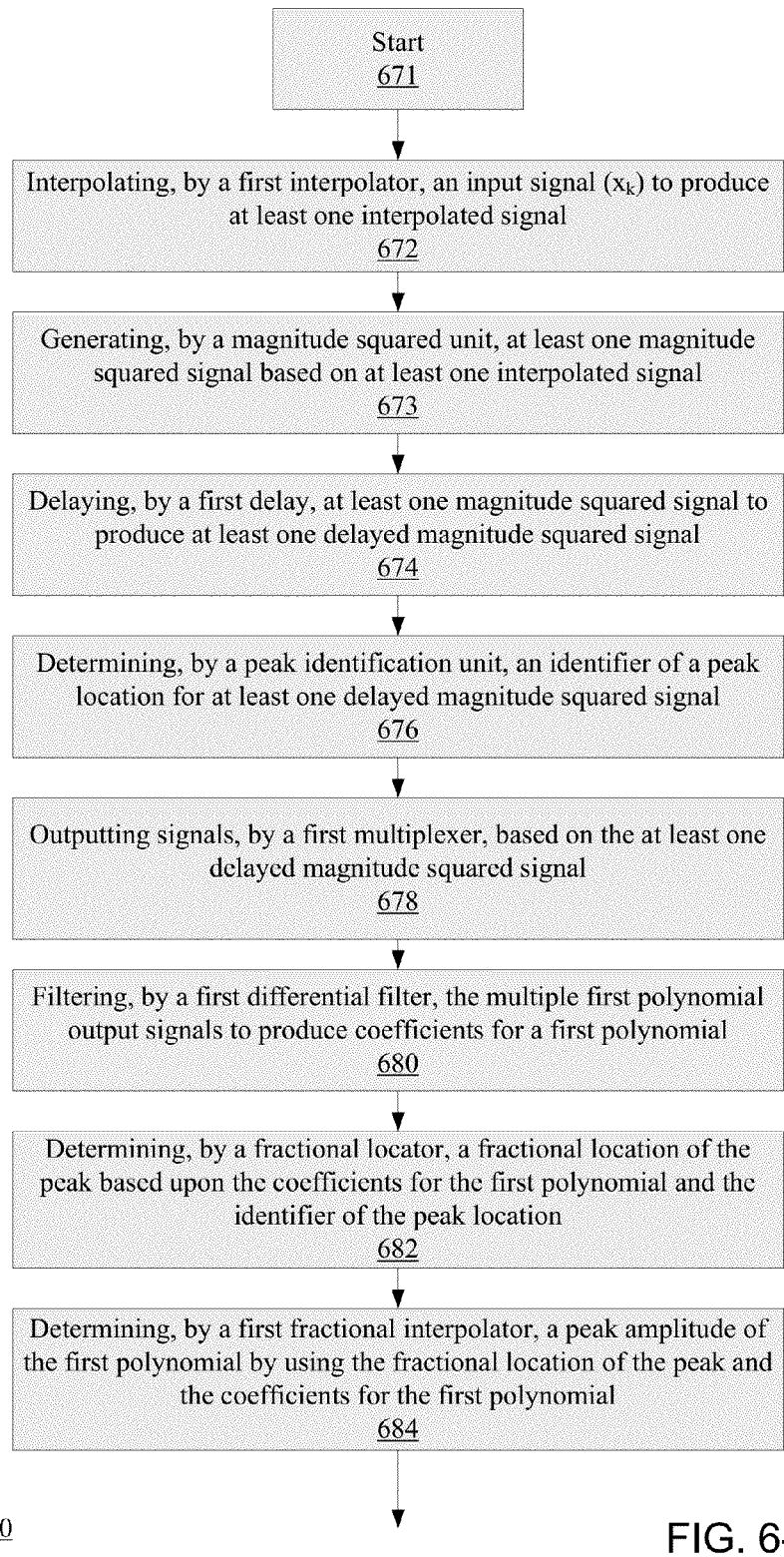
Figures 4, 6:
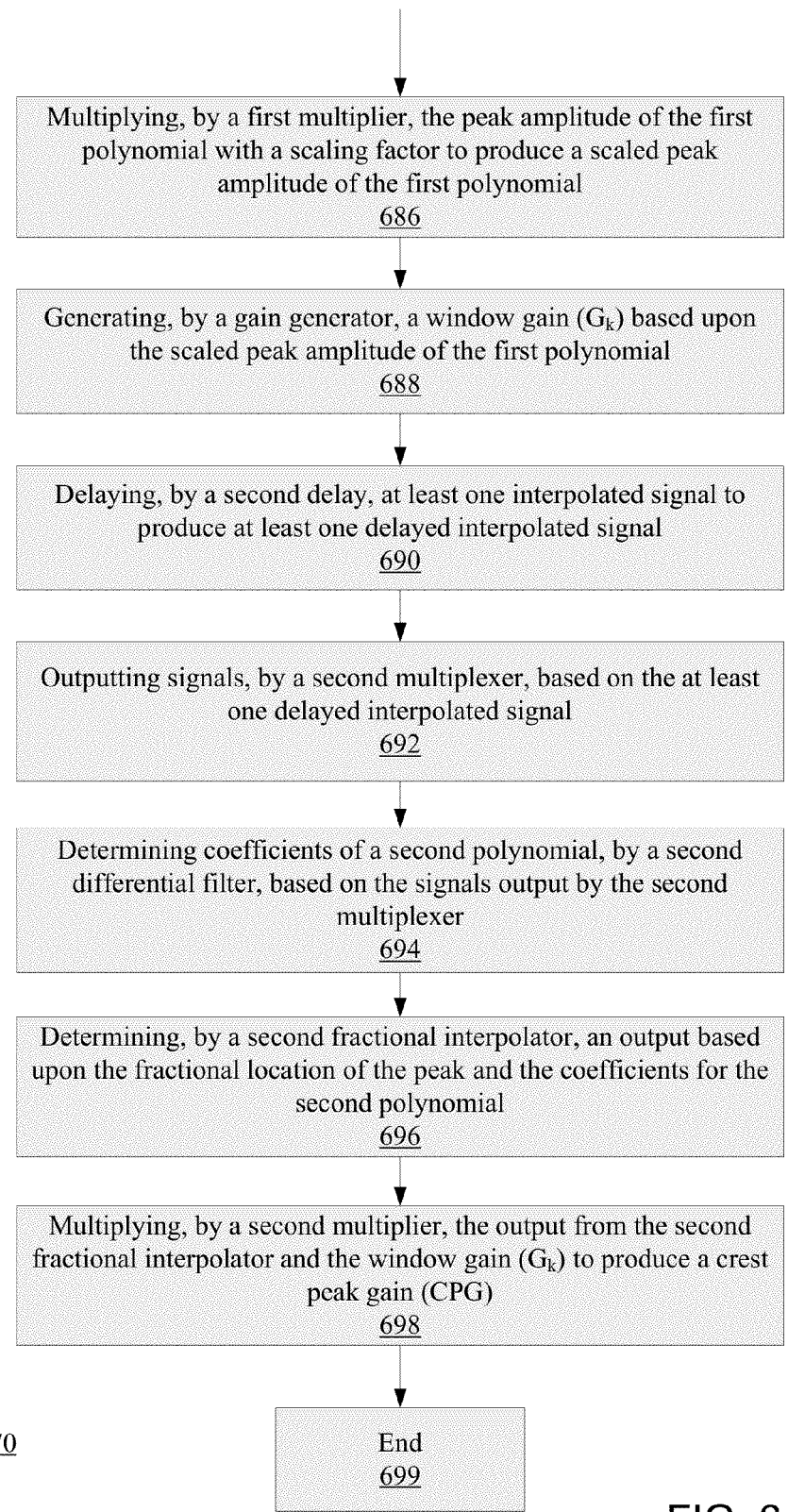

As discussed, the system 200 of FIG. 2-1 includes a peak detector 205, which may be implemented using any known peak detector. In other cases, the peak detector 205 may be a new peak detector as illustrated in FIG. 6-1. The peak detector 205 of FIG. 6-1 may be the peak detector 205 for the system 200 of FIG. 2-1. However, it should be noted that the peak detector 205 of FIG. 6-1 is not limited to being used in the field of CFR, and may be used in other technological areas.

As shown in FIG. 6-1, the peak detector 205 includes an interpolator 602, a magnitude squared unit 608, a first delay 612, a peak identification (ID) unit 616, a first multiplexer 620, a first differential filter 624, a fractional locater 628, a first fractional interpolator 632, a first multiplier 638, a gain generator 642, a second delay 646, a second multiplexer 650, a second differential filter 654, a second fractional interpolator 658, and a second multiplier 662.

The interpolator 602 is configured to receive an input signal ($x_k$), and interpolate the input signal ($x_k$) to produce at least one interpolated signal 604. In some cases, the interpolator may be a x4 interpolator. In other cases, the interpolator may be other types of interpolator. FIG. 6-2 illustrates an example of a x4 interpolator configured to provide two stages of interpolation by using a first half band filter in the first stage, followed by a second half band filter and a third half band filter in the second stage. The first half band filter (HBF1) provides six unique coefficients, and each of the second and third half band filters (HBF2) provides three unique coefficients.

The magnitude squared unit 608 is configured to receive the interpolated signals 604, and generate magnitude squared signals 610 based on the interpolated signals 604 by taking their magnitude and squaring them.

The first delay 612 is configured to receive the magnitude squared signals 610, and delay the magnitude squared signals 610 to produce delayed magnitude squared signals 614.

The peak ID unit 616 is configured to receive the delayed magnitude squared signals 614, and determine an identifier 618 of a peak location for the magnitude squared signals 614 based on the delayed magnitude squared signals 614. The identifier 618 of the peak location is passed to the fractional locater 628. In some cases, the peak ID unit 616 may be configured to examine a time series of the magnitudes of a signal. If the current magnitude is larger than the magnitude of the samples on either side, the current time location is then flagged as a peak. The identified time location may be considered an example of the identifier 618 of peak location. In some cases, delay from the delay 612 is provided so that the peak ID unit 616 receives multiple data points of the input signal sequentially. For example, the peak ID unit 616 may receive seven data points from an input signal. The peak ID unit 626 examines the seven data points and determines if a peak exist and outputs the peak index if one is found. This peak index may be used to select the found peak value and the neighbor on either side. For example, if the input signal is:

| Time index | magnitude of sample |
|---|---|
| 0 | 0 |
| 1 | 1 |
| 2 | 2 |
| 3 | 3 |
| 4 | 2 |
| 5 | 1 |
| 6 | 0 |

Then sample number 3 (with value 3 in the above example) is larger than sample 2 (having value 2) and sample 4 (having value 2). Accordingly, a peak is located at time 3 with a magnitude of 3. Following the above example, the subsequent processing looks at the magnitudes and finds the fractional offset relative to time 3 if the signal is interpolated. In other embodiments, the peak ID unit 616 may be configured to determine an identifier 618 of a peak location based on other parameters that are different from a delayed magnitude squared signals. For example, in other cases, the peak ID unit 616 may be configured to use any function that is monotonic with magnitude to determine the identifier 618 of a peak location. For example, in some cases, the magnitude of a complex value (sqrt(x*x+y*y) where x and y are the real and imaginary components of the complex value) may be used by the peak ID unit 616 to determine the identifier 618 of the peak location.

The first multiplexer 620 is configured to receive the delayed magnitude squared signals 614, and process the delayed magnitude squared signals 614 to produce first multiple output signals 622. The first multiple output signals 622 have a reduced number of data compared to the delayed magnitude squared signals 614. In some cases, the first multiplexer 620 is configured to select the largest sample magnitude found and the sample magnitude of the sample adjacent (e.g., before and after) the identified peak. Thus, in some cases, the first multiple output signals 622 may include peak magnitude and adjacent magnitudes. For examples, the first multiple output signals 622 may include a peak magnitude and two or more adjacent magnitudes, depending on the order of the interpolation desired. If three adjacent magnitudes on each side of a peak are desired, then the first multiple output signals 622 will include seven data (peak magnitude and three adjacent magnitudes on each side of the peak). If one adjacent magnitude on each side of a peak is desired, then the first multiple output signals 622 will include three data (peak magnitude and one adjacent magnitude on each side of the peak).

The differential filter 624 is configured to receive the first multiple output signals 622 from the multiplexer 620, and fit a polynomial for the first multiple output signals 622 (which has data points representing the peak magnitude and adjacent magnitudes next to the peak). In particular, once a peak is identified and isolated, an interpolation is performed to fit the location and magnitude at the peak. The interpolation may be a quadratic interpolation, or other order of interpolation. The samples are fitted with a quadratic polynomial (or polynomial having other order) using the differential filter 624. In some cases, the differential filter 624 produces coefficients 626 for a first polynomial that is used to fit the first multiple output signals 622.

The fractional locater 628 is configured to receive the coefficients 626 for the first polynomial from the first differential filter 624 and the identifier 618 of the peak location from the peak ID unit 616, and determine a fractional location 664 of the peak based on (e.g., using) the coefficients 626 for the first polynomial and the identifier 618 of the peak location. In some cases, the peak fractional location 664 may be determined based on coefficients of the quadratic polynomial $y(t)=a+b*t+c*t^2$. In such cases, the peak fractional location 664 may be computed by differentiating and finding the root at $-b/c/2$.

The first fractional interpolator 632 is configured to receive the fractional location 664 of the peak and the coefficients 626 for the first polynomial (passed on by the fractional locater 628), and determine a peak amplitude 634 of the first polynomial based on (e.g., using) the fractional location 664 of the peak and the coefficients 626 for the first polynomial. In some cases, the peak amplitude 534 may be determined by evaluating the equation $a+1.5*b*f$, where a and b are coefficients of the polynomial $y(t)=a+b*t+c*t^2$, and f is the fractional location 664.

The operations performed by the first differential filter 624, the fractional locater 628, and the fractional interpolator 632 allows the peak detector to determine a polynomial fit for the input signal $(x_k)$, determine a peak location from the polynomial, and determine a magnitude of signal at the peak location from the polynomial fit.

The first multiplier 638 is configured to receive the peak amplitude 634 of the first polynomial and a scaling factor 636, and multiply the peak amplitude 634 of the first polynomial with the scaling factor 636 to produce a scaled peak amplitude 640 of the first polynomial. In some cases, the scaling factor 636 may be 1 divided by the threshold squared (e.g., $1/T^2$). In other cases, the scaling factor 636 may be other values.

The gain generator 642 is configured to receive the scaled peak amplitude 640 of the first polynomial, and generate a window gain $(G_k)$ 644 based on (e.g., using) the scaled peak amplitude 640 of the first polynomial. In some cases, the window gain 644 may be determined to be $1-1/\mathrm{sqrt}(A)$, where A is the scaled peak amplitude 640 or a square of the scaled peak amplitude 640. In other cases, the window gain 644 may be determined to be $1-1/\mathrm{sqrt}(A/T^2)$. Also, n other cases, the window gain 644 may be determined based on other equations. Also, in some cases, the gain generator 642 may be configured to pass the window gain $(G_k)$ 644 to the running maximum filter 210 in the system 200 of FIG. 2-1.

As shown in FIG. 6-1, the second delay 646 is configured to receive the interpolated signals 604 from the interpolator 602, and delay the interpolated signals 604 to produce delayed interpolated signals 648.

The second multiplexer 650 is configured to receive the delayed interpolated signals 648, and process the delayed interpolated signals 648 to produce second multiple output signals 652. In some cases, the second multiplexer 650 is configured to select data from the delayed interpolated signals 648 that temporally corresponds to that selected by the multiplexer 620. The second multiple output signals 652 have a reduced number of data compared to the delayed interpolated signals 648.

The second differential filter 654 is configured to receive the second multiple output signals 652, and process the second multiple output signals 652 to produce coefficients 656 for a second polynomial. The operation performed by the second differential filter 654 is similar to that described with reference to the first differential filter 624. It should be noted that the first polynomial and the second polynomial are different, and the coefficients 626, 656 are also different. This is because the top branch of the peak detector 205 in FIG. 6-1 operates on magnitude, while the lower branch is for computing complex value at the peak. Accordingly, the coefficients 652 for the top branch are real numbers, while coefficients 656 for the lower branch are complex numbers. Also, in some cases, the first polynomial and/or the second polynomial may be a quadratic polynomial. In other cases, the first polynomial and/or the second polynomial may be other orders of polynomial.

The second fractional interpolator 658 is configured to receive the fractional location 664 from the fractional locater 628 and the coefficients 656 for the second polynomial, and generate output 660 based on (e.g., using) the fractional location 664 and the coefficients 656 for the second polynomial. In some cases, the output 660 may be determined by evaluating the equation $a+b*f+c*f*2$, where a, b, and c are coefficients of the polynomial $y(t)=a+b*t+c*t^2$, and f is the fractional location 664.

The second multiplier 662 is configured to receive the signal 660 and the window gain ($G_k$) 644, and multiply the signal 660 and the window gain ($G_k$) 644 to produce a crest peak gain (CPG).

In some cases, the peak detector 205 may be implemented using at least one FPGA. For example, in some cases, a FPGA may be configured to implement the interpolator 602, the magnitude squared unit 608, the first delay 612, the peak ID unit 616, the first multiplexer 620, the first differential filter 624, the fractional locater 628, the first fractional interpolator 632, the first multiplier 638, the gain generator 642, the second delay 646, the second multiplexer 650, the second differential filter 654, the second fractional interpolator 658, the second multiplier 662, or any combination of the foregoing. In other cases, the peak detector 205 may be implemented using any integrated circuit, such as a general purpose processor, an ASIC processor, a microprocessor, or other types of processor. In further cases, the peak detector 205 may be implemented using hardware, software, or a combination of both.

It should be noted that the peak detector 205 in FIG. 6-1 may be used for PCCFR. In such cases, the peak detector 205 may only need to output the fractional location 664 of the peak and the CPG. In other cases, if window CFR is used, then the bottom branch (i.e., the second delay 646, the second multiplexer 650, the second differential filter 654, the second fractional interpolator 658, and the second multiplier 662) of the peak detector 205 is optional and may not be needed. In such cases, the peak detector 205 may only need to output the factional location 664 of the peak and the window gain 644.

Also, it should be noted that the peak detector 205 shown in FIG. 6-1 includes a peak scaling unit. In particular, the multiplier 638 and the gain generator 642 may constitute the peak scaling unit 206 for the window CFR processor 220 of FIG. 2-1. In such cases, the window CFR processor 220 may not include the peak scaling unit 206. In other cases, the multiplier 638 and the gain generator 642 may be incorporated into the window CFR processor 220 of FIG. 2-1 as the peak scaling unit 206. Also, in the case in which the peak detector 205 is used with the PCCFR processor of FIG. 5-1 or 5-2, the multiplier 638, the gain generator 642, and the multiplier 662 may constitute the peak scaling unit 206 for the PCCFR processor 220 of FIG. 5-1 or 5-2. In such cases, the PCCFR processor 220 of FIG. 5-1 or 5-2 may not include the peak scaling unit 206. In other cases, the multiplier 638, the gain generator 642, and the multiplier 638 may be incorporated into the PCCFR processor 220 of FIG. 5-1 or 5-2 as the peak scaling unit 206.

FIGS. 6-3 and 6-4 illustrate a method 670 that may be performed by the peak detector 205 of FIG. 6-1. In other cases, the method 670 may be performed by other peak detectors. At item 671, the method begins.

An interpolator interpolates an input signal ($x_k$) to produce at least one interpolated signal (item 672). In some cases, item 672 may be performed by the interpolator 602 in the peak detector 205.

Next, a magnitude squared unit generates at least one magnitude squared signal based on at least one interpolated signal (item 673). In some cases, item 673 may be performed by the magnitude squared unit 608 in the peak detector 205.

Next, a first delay then delays at least one magnitude squared signal to produce at least one delayed magnitude squared signal (item 674). In some cases, item 674 may be performed by the first delay 612 in the peak detector 205.

In addition, a peak ID unit determines an identifier of a peak location for at least one delayed magnitude squared signal (item 676). In some cases, item 676 may be performed by the peak ID unit 616 in the peak detector 205.

A first multiplexer then receives at least one delayed magnitude squared signal to produce multiple output signals based on the at least one delayed magnitude squared signal (item 678). In some cases, item 678 may be performed by the first multiplexer 620 in the peak detector 205.

Next, a first differential filter receives the output signals from the multiplexer to determine coefficients for a first polynomial (item 680). In some cases, item 680 may be performed by the first differential filter 624 in the peak detector 205.

A fractional locater then determines a fractional location of the peak based on the coefficients for the first polynomial and the identifier of the peak location (item 682). In some cases, item 682 may be performed by the fractional locater 628 in the peak detector 205.

A first fractional interpolator then determines a peak amplitude of the first polynomial based on the fractional location of the peak and the coefficients for the first polynomial (item 684). In some cases, item 684 may be performed by the first fractional interpolator 632 in the peak detector 205.

A first multiplier multiplies the peak amplitude of the first polynomial with a scaling factor to produce a scaled peak amplitude of the first polynomial (item 686). In some cases, item 686 may be performed by the first multiplier 638 in the peak detector 205.

Then, a gain generator generates a window gain ($G_k$) based on the scaled peak amplitude of the first polynomial (item 688). In some cases, item 688 may be performed by the gain generator 642 in the peak detector 205.

A second delay delays at least one interpolated signal to produce at least one delayed interpolated signal (item 690). In some cases, item 690 may be performed by the second delay 646 in the peak detector 205.

Next, a second multiplexer processes at least one delayed interpolated signal to produce multiple output signals (item 692). In some cases, item 692 may be performed by the second multiplexer 650 in the peak detector 205.

Next, a second differential filter processes the output signals from the second multiplexer 650 to produce coefficients for a second polynomial (item 694). In some cases, item 694 may be performed by the second differential filter 654 in the peak detector 205.

Next, a second fractional interpolator then determines an output by using a signal from a fractional locator and the coefficients for the second polynomial (item 696). In some cases, item 696 may be performed by the second fractional interpolator 658 in the peak detector 205.

Then, a second multiplier multiplies the output from the second fractional interpolator and the window gain ($G_k$) to produce a crest peak gain (CPG) (item 698). In some cases, item 698 may be performed by the second multiplier 662 in the peak detector 205. Then, the method 670 ends at item 699.

In some cases, the method 670 may not include items 690, 692, 694, 696, and 698, and these items are optional.

As illustrated in the above examples, the disclosed peak detector 205 and method 670 for peak detection limit the amount of oversampling by performing a polynomial fit (e.g., a quadratic fit) to the signal magnitude, and then extracting the peak location. From the polynomial fit, the peak location is used to compute the magnitude of the signal at that location as if the peak had been found with a much higher sampling rate. In some cases, if the complex value at the peak is required, then the derivative and second derivative may be determined, and may then be used in the polynomial fit. Also, in some cases, a higher order polynomial may be used to fit more samples surrounding a peak. However, quadratic polynomial may be considered a better tradeoff between complexity and performance for most applications. Also, in some cases, the magnitude squared data may be used in a fractional offset computations. This is due to the fact that detection of signal magnitude may require a higher sampling rate. The magnitude squared data may be guaranteed to have a bandwidth that cannot exceed two (or other prescribed value) times the input sample bandwidth, thereby reducing the amount of oversampling required for a given accuracy requirement.

The above approach also allows for a more unified design and optimization of CFR, as the peak detector 205 may dominate the accuracy and resources required in CFR. In window CFR and PCCFR, the filtering stages may be done near the Nyquist sampling rate, thereby reducing the resources needed after the processing by the peak detector 205, as the post-peak detector processing are near linear operations on the signal. Only the peak detector 205 requires interpolation or other equivalent processing. By implementing the peak detector 205 in a polyphase approach, the entire design may operate at the lowest possible rates, thereby allowing for very high bandwidth signals to be processed compared to more traditional approaches.

Figure 7:
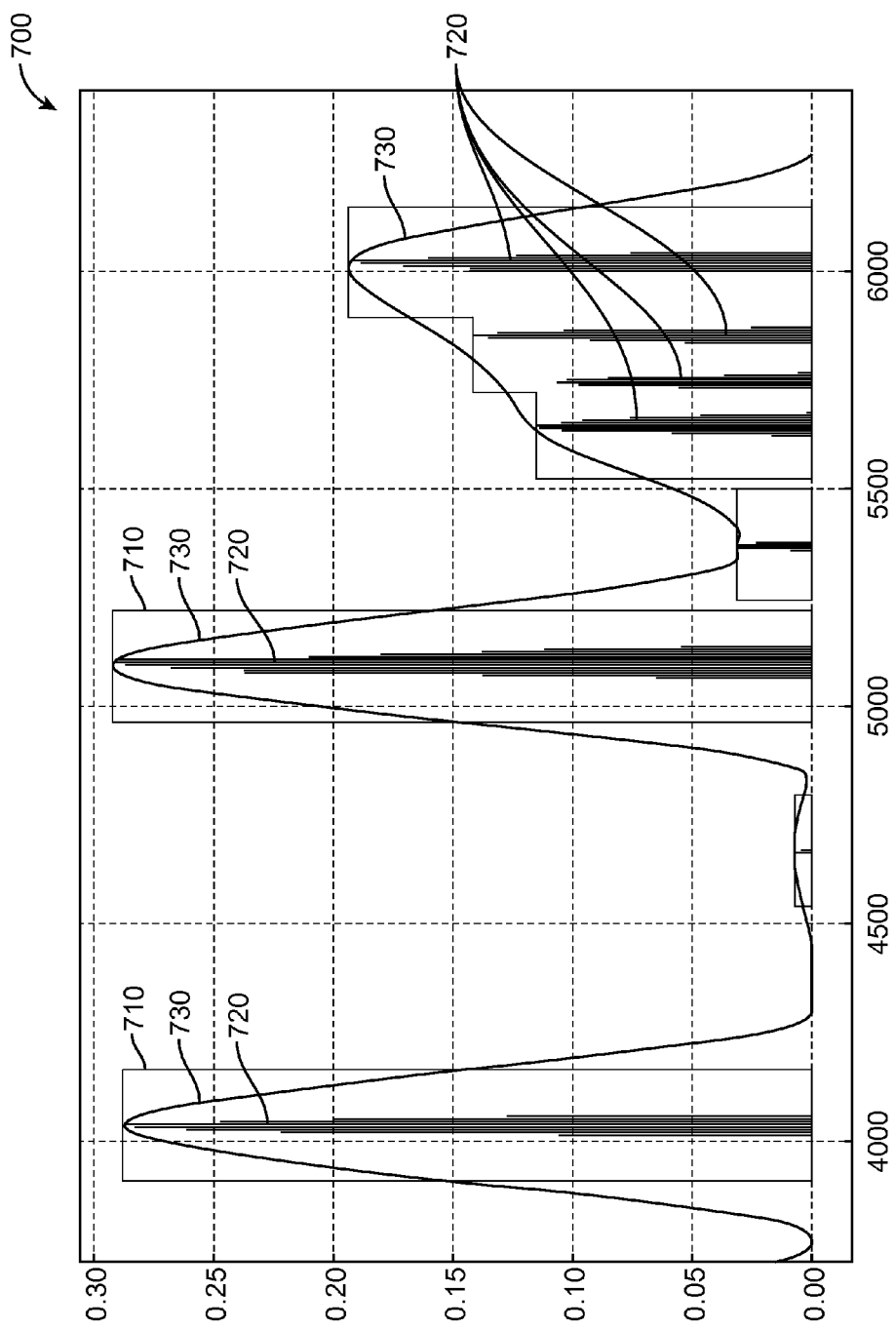
FIG. 7 is a graph showing examples of results achieved using the disclosed system and method.

FIG. 7 is a graph 700 showing examples of results achieved using the disclosed system and method. The results are generated using a window CFR processor, like that described with reference to FIG. 2-2. The graph 700 includes a plurality of rectangular boxes 710. Each rectangular box 710 has a width of N, and represents the time history of the running maximum filter output that follows an increasing amplitude of the input signal ($x_k$). The vertical peaks 720 at the center (N/2) of the respective rectangular boxes 710 represent the locations of the center of the window function for the CFR and its peak amplitude. The smooth curve 730 represents the gain correction ($F_k$) that is applied to the input signal ($x_k$) to prevent the output signal ($y_k$) from exceeding the threshold (T). The application of the continuous gain correction $F_k$ maintains the output signal ($y_k$) within the required spectrum. As shown in the figure, using the running maximum filter mostly shadows smaller peaks so that smaller peak contributions are not counted that would have been masked with the relatively larger peaks. This discovery greatly simplifies the implementation of the window CFR processor, making it a practical last stage in a CFR subsystem. An example of a system that includes a window CFR processor in a last stage will be described below with reference to FIG. 8.

Also, as shown in FIG. 7, the curve 730 (which is the signal created using a running maximum filter followed by a linear filter) overbounds the peaks 720 very well and is band limited. Thus, the use of running maximum filter followed by a linear filter is found to be very a simple and effective technique in creating the window CFR gain profile (represented by the curve 730). Other techniques may be used to create a band limited signal that overbounds all of the peaks present, but they are more complex, result in low performance, and/or may not create a signal that overbounds all of the peaks.

It should be noted that an advantage of utilizing window CFR is that it prevents peaks from being missed in the detection, and also prevents new peaks from occurring at the output. A disadvantage of using window CFR is that the performance (which may be measured by metrics such as error vector magnitude (EVM) versus PAR) may not be as good as the PCCFR method. However, the combination of using PCCFR and window CFR provides a good compromise in terms of complexity and performance. If the PCCFR eliminates most of the peaks with a good EVM, then the window CFR may be used to "clean up" the remaining peaks. If there are few remaining peaks, the degradation by using window CFR compared to using more stages of PCCFR is very small. As such, in some cases, window CFR may be used as a post processing after one or more PCCFR stages. However, in other cases, the window CFR may be used before one or more PCCFR stages, or may be used alone without any PCCFR stages.

Figure 8:
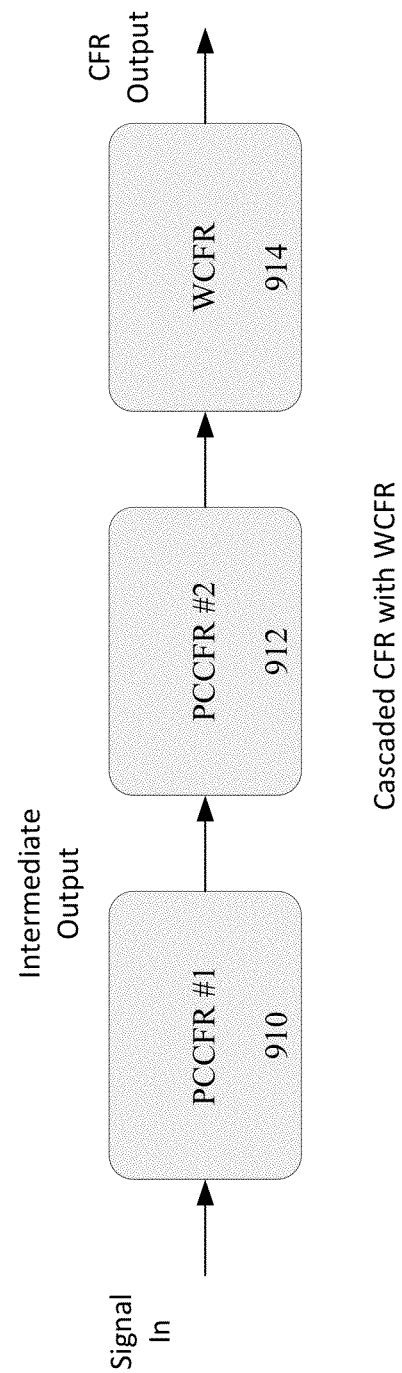
FIG. 8 illustrates a system that includes a combination of a window CFR module and PCCFR modules.

In some cases, it may be desirable to use a combination of window CFR and peak cancellation crest factor reduction (PCCFR). FIG. 8 shows a system that includes a combination of window CFR and PCCFR. As shown in the figure, the system has a first PCCFR module 910, a second PCCFR module 912, and a window CFR module 914. In some cases, the first PCCFR module 910 and/or the second PCCFR module 912 may be implemented using the PCCFR processor of FIG. 5-1 or 5-2. Also, in some cases, the window CFR module 914 may be implemented using the window CFR processor of FIG. 2-2. The first PCCFR module 910 is configured to receive input signal, and process the input signal by performing a first PCCFR to obtain a first PCCFR output. In some cases, the first PCCFR output includes the input signal but with a first set of one or more peaks removed. The second PCCFR module 912 is configured to process the first PCCFR output by performing a second PCCFR to obtain a second PCCFR output. In some cases, the second PCCFR output includes the input signal but with a second set of one or more peaks removed. The window CFR module 912 is configured to receive the second PCCFR output and perform window CFR to obtain a CFR output. In some cases, the CFR output includes the input signal but one or more additional peaks removed (after the first and second sets of peak(s) have been removed by the first PCCFR module 910 and the second PCCFR module 912). In the illustrated figure, there are two PCCFR modules 912, 914 for performing two stages of PCCFR. In other cases, there may be only one PCCFR module for performing only one stage of PCCFR. In further cases, there may be more than two PCCFR modules for performing more than two respective stages of PCCFR. In other cases, a PCCFR module may be used to implement multiple stages of PCCFR.

The system of FIG. 8 is advantageous over the use of PCCFR alone, and the use of window CFR alone. PCCFR, when used alone, has the advantage that the EVM vs. PAR is better than that of window CFR. However, PCCFR suffers from the fact that some peaks may be missed due to the lack of CPG resources, and the cancellation pulses involved in PCCFR may introduce new peaks into the output. Therefore when using PCCFR, multiple passes may be required to remove all of the peaks in a signal. This reprocessing of the data introduces additional delay, which in turn, may degrade a base station performance due to this latency. If the latency is large, then the control information to a smart phone is delayed, making the system less responsive to changes in the data flow. This effect reduces the peak data rates that can be supported on a cell phone, and may create other detrimental effects if the latency is too large. When applying PCCFR, four stages of processing may be used to remove all of the peaks from the signal, which introduces a delay of 4 times the delay through one stage. On the other hand, window CFR, when used alone, has an advantage that no peaks are missed in its operation. The disadvantage of window CFR is that it has a higher EVM vs. PAR performance as some peaks may be over-canceled. The combination of PCCFR and WCFR may benefit from the advantages of both methods.

In the system of FIG. 8, when the input signal is first processed by one or more PCCFR stages, most of the peaks in the input signal may be removed or reduced to a low level. Then if the window CFR is used to remove the few remaining peaks, the added EVM introduced by the window CFR will be very low compared to that if PCCFR is used alone, as most of the peaks have been removed by the PCCFR stage(s). In some cases, only one PCCFR stage and one window CFR stages may be used. The resulting delay through the PCCFR and WCFR are comparable, but the performance is nearly as good as the four stage PCCFR. Therefore such combination achieve acceptable performance with half of the processing and delay (compared to that if PCCFR is used alone), thereby reducing system cost.

The methods (e.g., the methods 250, 670) described above indicate certain events occurring in certain order. In other cases, the ordering of the events in the methods may be different. Additionally, parts of methods may be performed concurrently in a parallel process when possible, or may be performed sequentially. In addition, more parts or less part of the methods may be performed.

In the above embodiments, the peak detector 205 and the method 670 for peak detection have been described with reference to window CFR. However, in other cases, the peak detector 205 and the method 670 for peak detection may be applied in other areas. For example, in other cases, the peak detector 205 and the method 670 for peak detection may be used in image processing. In some cases, the peak detector 205 and the method 670 may be used in image processing to establish a true image peak for image scaling before rotations, before scaling, or before other image processing operations to ensure that the pixel values in an image do not overflow any of the linear transformation processing. In other cases, the peak detector 205 and the method 670 may be used in image processing for contrast enhancement, gamma correction, and/or other nonlinear processing. In further cases, the peak detector 205 and the method 670 for peak detection may be used in automatic gain control. For example, in some cases, the peak detector 205 and the method 670 may be used to detect peak signal level for automatic gain control to place signal in an optimum range for either digital processing, or for processing by an analog circuitry in a radio or radar like application. Furthermore, in other cases, the peak detector 205 and the method 670 for peak detection may be implemented in any types of detector, such as, root mean square (RMS) detector, log detector, etc. In some cases, output from the peak detector 205 may be used with a RMS detector to measure a PAR of a signal. Also, in some cases, the peak detector 205 may be used to implement a digital version of an AM detector. In other cases, the peak detector 205 may be used to implement an equivalent version of a digital log detector.

Although particular embodiments have been shown and described, it will be understood that it is not intended to limit the claimed inventions. The specification and drawings are, accordingly, to be regarded in an illustrative rather than restrictive sense. The claimed inventions are intended to cover alternatives, modifications, and equivalents.

What is claimed is:

1. A system for crest factor reduction (CFR), comprising:
a peak detector configured to receive an input signal ($x_k$);
a running maximum filter configured to generate a scaling factor based on a window gain ($G_k$) and a filter length, wherein the window gain ($G_k$) is based on the input signal ($x_k$) and a threshold value (T);
a window CFR gain filter configured to generate a gain correction ($F_k$) based on the scaling factor and the filter length;
a delay configured to delay the input signal ($x_k$) to generate a delayed input signal;
a multiplier configured to multiply the gain correction ($F_k$) by the delayed input signal to obtain a peak correction value; and
an adder configured to determine an output signal ($y_k$) based on the peak correction value and the delayed input signal;
wherein the peak detector, the running maximum filter, the window CFR gain filter, the delay, the multiplier, the adder, or any combination of the foregoing, is implemented in at least one integrated circuit.

2. The system of claim 1, wherein the running maximum filter is configured to generate the scaling factor by determining a maximum gain of the window gain ($G_k$) over the filter length.

3. The system of claim 1, wherein the window CFR gain filter comprises a Hanning window filter.

4. The system of claim 1, wherein the window CFR gain filter comprises a Blackman window filter.

5. The system of claim 1, wherein the filter length corresponds to N samples, where N is an integer.

6. The system of claim 5, wherein the window CFR gain filter is centered at N/2.

7. The system of claim 1, wherein the gain correction ($F_k$) comprises a continuous function.

8. The system of claim 1, further comprising a peak scaling unit for providing the window gain ($G_k$).

9. The system of claim 1, wherein the at least one integrated circuit comprises at least one field programmable gate array (FPGA).

10. The system of claim 1, wherein the peak detector is configured to:
- determine a polynomial fit for the input signal ($x_k$),
- determine a peak location, and
- determine a magnitude of signal at the peak location from the polynomial fit.

11. A method for crest factor reduction (CFR), comprising:
- receiving input signal ($x_k$) by a peak detector;
- generating, using a running maximum filter, a scaling factor based on a window gain ($G_k$) and a filter length, wherein the window gain ($G_k$) is based on the input signal ($x_k$) and a threshold value (T);
- generating, using a window CFR gain filter, a gain correction ($F_k$) based on the scaling factor and the filter length;
- delaying, by a delay, the input signal ($x_k$) to obtain a delayed input signal;
- multiplying, using a multiplier, the gain correction ($F_k$) by the delayed input signal to obtain a peak correction value; and
- adding the peak correction value to the delayed input signal to obtain an output signal ($y_k$);
- wherein the peak detector, the running maximum filter, the window CFR gain filter, the delay, the multiplier, or any combination of the foregoing, is implemented in at least one integrated circuit.

12. The method of claim 11, wherein the act of generating the scaling factor comprises determining a maximum gain of the window gain ($G_k$) over the filter length.

13. The method of claim 11, wherein the window CFR gain filter comprises a Hanning window filter or a Blackman window filter.

14. The method of claim 11, wherein the filter length corresponds to N samples, where N is an integer.

15. The method of claim 14, wherein the window CFR gain filter is centered at N/2.

16. The method of claim 11, wherein the gain correction ($F_k$) comprises a continuous function.

17. The method of claim 11, further comprising determining, using a peak scaling unit, the window gain ($G_k$) based on the input signal ($x_k$) and the threshold value (T).

* * * * *